(12) United States Patent
Shinjo et al.

(10) Patent No.: US 6,239,595 B1
(45) Date of Patent: May 29, 2001

(54) MAGNETIC FIELD SENSING ELEMENT

(75) Inventors: Izuru Shinjo; Yasuyoshi Hatazawa; Tatsuya Fukami; Motohisa Taguchi; Kazuhiko Tsutsumi; Yuuichi Sakai; Naoki Hiraoka, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/196,348

(22) Filed: Nov. 19, 1998

(30) Foreign Application Priority Data

May 13, 1998 (JP) .................................................. 10-130732

(51) Int. Cl.⁷ .................................................. G01R 33/02
(52) U.S. Cl. .................. 324/252; 324/207.21; 338/32 R
(58) Field of Search ................................. 324/252, 207.2, 324/207.21, 251, 235, 207.12; 327/510, 511; 257/427; 338/32 R, 32 H

(56) References Cited

FOREIGN PATENT DOCUMENTS

| 43 17 512 | 12/1994 | (DE) . |
|---|---|---|
| 196 22 040 | 12/1996 | (DE) . |
| 197 44 090 | 10/1998 | (DE) . |
| 0 660 127 | 6/1995 | (EP) . |
| 2 648 942 | 12/1990 | (FR) . |
| 3-52111 | 3/1991 | (JP) . |

OTHER PUBLICATIONS

"Magnetoresistance of Multilayers" Journal of Applied Magnetism Society of Japan, vol. 15, No. 51991, pp. 813–821, 1991.

Primary Examiner—Christine Oda
Assistant Examiner—Anthony Jolly
(74) Attorney, Agent, or Firm—Sughrue, Mion, Zinn, Macpeak & Seas, PLLC

(57) ABSTRACT

A magnetic field sensing element comprises an underlayer formed on a substrate, a giant magnetic resistance element formed on the underlayer for detecting a change in a magnetic field, and an integrated circuit formed on the substrate for carrying out predetermined arithmetic processing based on a change in a magnetic field detected by the giant magnetic resistance element, wherein the giant magnetic resistance element and the integrated circuit are formed on the same surface.

1 Claim, 20 Drawing Sheets

MAGNETIC FIELD SENSING ELEMENT

BACKGROUND OF THE INVENTION

1. Field of the Invention

The present invention relates to a magnetic field sensing element for detecting a change in a magnetic field, and more particularly, to the element used in a device for detecting the rotation of a magnetic body.

2. Description of the Related Art

Generally, a magnetic resistance element (hereinafter referred to as an MR element) is an element whose resistance changes depending on an angle formed by the direction of magnetization of a ferromagnetic body (Ni-Fe or Ni-Co, for example) thin film and the direction of an electric current. The resistance of such an MR element is minimum when the direction of an electric current and the direction of magnetization cross at right angles to each other, and is maximum when the angle formed by the direction of an electric current and the direction of magnetization is 0°, that is, when the directions are the same or completely opposite. Such a change in resistance is referred to as an MR rate of change, and is typically 2–3% with respect to Ni-Fe and 5–6% with respect to Ni-Co.

FIGS. 34 and 35 are a side view and a perspective view, respectively, showing the structure of a conventional magnetic field sensing device.

As shown in FIG. 34, the conventional magnetic field sensing device comprises a rotation axis 41, a magnetic rotating body 42 which has at least one concavity and convexity and which rotates synchronously with the rotation of the rotation axis 41, an MR element 43 arranged with a predetermined gap between the magnetic rotating body 42, a magnet 44 for applying a magnetic field to the MR element 43, and an integrated circuit 45 for processing an output of the MR element 43. The MR element 43 has a magnetic resistance pattern 46 and a thin film surface (magnetic-sensitive surface) 47.

In such a magnetic field sensing device, rotation of the magnetic rotating body 42 causes a change in the magnetic field penetrating the thin film surface 47 which is the magnetic-sensitive surface of the MR element 43, resulting in a change in the resistance of the magnetic resistance pattern 46.

However, since the output level of the MR element as a magnetic field sensing element used in such a magnetic field sensing device is low, the detection can not be highly accurate. In order to solve this problem, a magnetic field sensing element using a giant magnetic resistance element (hereinafter referred to as a GMR element) having a high output level has been recently proposed.

FIG. 36 is a graph showing the characteristics of a conventional GMR element.

The GMR element showing the characteristics in FIG. 36 is a laminated body (Fe/Cr, permalloy/Cu/Co/Cu, Co/Cu) as a so-called artificial lattice film where magnetic layers and non-magnetic layers with thicknesses of several angstroms to several dozen angstroms are alternately laminated. This is disclosed in an article entitled "Magnetic Resistance Effects of Artificial Lattices," Japan Applied Magnetics Society Transactions, Vol. 15, No. 51991, pp. 813–821. The laminated body has a much larger MR effect (MR rate of change) than the above-mentioned MR element, and, at the same time, is an element which shows the same change in resistance irrespective of the angle formed by the direction of an external magnetic field and the direction of an electric current.

In order to detect a change in the magnetic field, the GMR element substantially forms a magnetic-sensitive surface. Electrodes are formed at the respective ends of the magnetic-sensitive surface to form a bridge circuit. A constant-voltage and constant-current power source is connected between the two facing electrodes of the bridge circuit. The change in the magnetic field acting on the GMR element is detected by converting a change in the resistance of the GMR element into a change in voltage.

FIGS. 37 and 38 are a side view and a perspective view, respectively, showing the structure of a magnetic field sensing device using a conventional GMR element.

In FIGS. 37 and 38, the magnetic field sensing device comprises a rotation axis 41, a magnetic rotating body 42 as a means for imparting a change to a magnetic field, the body having at least one concavity and convexity and having rotatable synchronously with the rotation of the rotation axis 41, a GMR element 48 arranged with a predetermined gap between the magnetic rotating body 42, a magnet 44 as a magnetic field generating means for applying a magnetic field to the. GMR element 48, and an integrated circuit 45 for processing an output of the GMR element 48. The GMR element 48 has a magnetic resistance pattern 49 as a magnetic-sensitive pattern and a thin film surface 50.

In such a magnetic field sensing device, rotation of the magnetic rotating body 42 causes a change in the magnetic field penetrating the thin film surface (magnetic-sensitive surface) 47 of the GMR element 48, resulting in a change in the resistance of the magnetic resistance pattern 49.

FIG. 39 is a block diagram showing the magnetic field sensing device using the conventional GMR element.

FIG. 40 is a block diagram showing the detail of the magnetic field sensing device using the conventional GMR element.

The magnetic field sensing device shown in FIGS. 39 and 40 is arranged with a predetermined gap between the magnetic rotating body 42 and itself, and comprises a Wheatstone bridge circuit 51 using the GMR element 48 to which a magnetic field is applied by the magnet 44, a differential amplification circuit 52 for amplifying the output of the Wheatstone bridge circuit 51, a comparison circuit 53 for comparing the output of the differential amplification circuit 52 with a reference value to output a signal of either "0" or "1," and an output circuit 54 that switches in response to the output of the comparison circuit 53.

FIG. 41 shows an example of the structure of a circuit of the magnetic field sensing device using the conventional GMR element.

In FIG. 41, the Wheatstone bridge circuit 51 has on its respective sides GMR elements 48a, 48b, 48c, and 48d, for example, with the GMR elements 48a and 48c being connected with a power source terminal VCC, the GMR elements 48 and 48d being polished, the other ends of the GMR elements 48a and 48b being connected with a connection 55, and the other ends of the GMR elements 48c and 48d being connected with a connection 56.

The connection 55 of the Wheatstone bridge circuit 51 is connected with an inverting input terminal of an amplifier 59 of a differential amplification circuit 58 via a resistor 57. The connection 56 is connected with a non-inverting input terminal of the amplifier 59 via a resistor 60, and is further connected with a voltage dividing circuit 62 for forming a reference voltage based on the voltage supplied from the power source terminal VCC via a resistor 61.

An output terminal of the amplifier 59 is connected with its own inverting input terminal via a resistor 63, and is further connected with an inverting input terminal of a comparison circuit 64. A non-inverting input terminal of the comparison circuit 64 is connected with a voltage dividing circuit 66 for forming a reference voltage based on the voltage supplied from the power source terminal VCC, and is further connected with an output terminal of the comparison circuit 64 via a resistor 67.

An output end of the comparison circuit 64 is connected with a base of a transistor 69 of an output circuit 68. The collector of the transistor 69 is connected with an output terminal of the output circuit 68 and is further connected with the power source terminal VCC via a resistor 71. The emitter of the transistor 69 is polished.

FIG. 42 shows the structure of the conventional magnetic field sensing element.

FIG. 43 is a graph showing operating characteristics of the conventional magnetic field sensing element.

As shown in FIG. 42, the Wheatstone bridge comprises the GMR element 48 (formed of 48a, 48b, 48c, and 48d).

As shown in FIG. 43, rotation of the magnetic rotating body 42 causes a change in the magnetic field supplied to the GMR element 48 (48a to 48d), and output corresponding to the concavities and the convexities of the magnetic rotating body 42 can be obtained at an output end of the differential amplification circuit 58.

The output of the differential amplification circuit 58 is supplied to the comparison circuit 64, compared with the reference value as the comparison level, converted into a signal of either "0" or "1," and the signal is further made into a waveform by the output circuit 68. As a result, as shown in FIG. 43, an output of "0" or "1" with steep leading and trailing edges can be obtained at the output terminal 70.

However, since the GMR element used above-mentioned magnetic field sensing element is sensitive, it is necessary to, for example, smooth the surface of the underlayer on which the GMR element is formed in order to fully bring out its characteristics. Therefore, it is difficult to, for example, form the GMR element on the same surface the integrated circuit is formed.

This makes it necessary to separately form the GMR element and the integrated circuit and then electrically connect them with each other, which leads to low productivity and high manufacturing costs.

Further, since the output of the comparison circuit depends on the gap between the magnetic rotating body and the magnetic field sensing element, there is a problem in that the so-called gap characteristics are bad.

SUMMARY OF THE INVENTION

The present invention is made to solve the problems mentioned above, and therefore an object of the present invention is to provide a magnetic field sensing element with low cost, high productivity, and high detection accuracy, and a magnetic field sensing device using the magnetic field sensing element.

According to an aspect of the present invention, there is provided a magnetic field sensing element comprising: an underlayer formed on a substrate; a giant magnetic resistance element formed on the underlayer for detecting a change in a magnetic field; and an integrated circuit formed on the underlayer for carrying out predetermined arithmetic processing based on a change in a magnetic field detected by the giant magnetic resistance element, wherein the giant magnetic resistance element and the integrated circuit are formed on the same surface.

In a preferred form of the invention, a metal film formed on the underlayer for forming the integrated circuit which is not in a region for forming the integrated circuit is patterned to form wiring for connecting the giant magnetic resistance element and the integrated circuit.

In accordance with another aspect of the present invention, the wiring are formed by wet etching of the metal film and has a tapered shape in section.

In accordance with a further aspect of the present invention, a first level difference buffer layer is formed on the underlayer in a region for forming the giant magnetic resistance element to decrease a difference in the levels between the surface of the metal film for forming the wiring and a surface for forming the giant magnetic resistance element, and the giant magnetic resistance element is formed on the first level difference buffer layer.

In a further preferred form of the invention, the first level difference buffer layer is formed of an insulating layer, and the level difference between the first level difference buffer layer and the surface of the metal film for forming the wiring is sufficiently smaller than the film thickness of the giant magnetic resistance element.

In a still further preferred form of the invention, the first level difference buffer layer is a resist layer or resin layer having fluid characteristics formed by spin coating, and the level difference between the first level difference buffer layer and the surface of the metal film for forming the wiring is sufficiently smaller than the film thickness of the giant magnetic resistance element.

In accordance with a still further aspect of the invention, in order to form the giant magnetic resistance element, a portion of the giant magnetic resistance element film formed on the integrated circuit is left unremoved, and a protective film is formed on the unremoved giant magnetic resistance element film after a giant magnetic resistance element film is formed on the entire surface of the integrated circuit and the wiring.

In accordance with a yet further aspect of the invention, there is provided a magnetic field sensing element comprising: an integrated circuit, an underlayer, and a metal pad formed on a substrate in the order stated, provided with: a second level difference buffer layer formed on the underlayer and the metal pad to absorb the level difference between the surface of the underlayer and the surface of the metal pad; and a giant magnetic resistance element formed on the second level difference buffer layer.

In a further preferred form of the invention, the second level difference buffer layer has a surface that is smoothed by polishing, and the giant magnetic resistance element is formed on the smoothed surface of the second level difference buffer layer.

In a further preferred form of the invention, the second level difference buffer layer is a resist layer or resin layer having a smoothed surface formed by spin coating and the giant magnetic resistance element is formed on the smoothed surface of the smoothed resist layer or resin layer.

In accordance with a yet further aspect of the invention, there is provided a magnetic field sensing element comprising: an underlayer formed on one surface of a substrate; a giant magnetic resistance element formed on the underlayer, for detecting a change in a magnetic field; and an integrated circuit formed on the surface opposite to the surface where the giant magnetic resistance element of the substrate is formed, for carrying out predetermined arithmetic processing based on a change in a magnetic field detected by the giant magnetic resistance element.

In a further preferred form of the invention, an underlayer and a giant magnetic resistance element are further formed on the integrated circuit formed on the other surface of the substrate.

In a further preferred form of the invention, mean surface roughness of the underlayer is 50 Å or less.

In a further preferred form of the invention, mean surface roughness of the underlayer is between 1 Å and 25 Å.

In a further preferred form of the invention, further comprising a differential amplifier and a comparator on a line for transmitting output of the giant magnetic resistance element to the integrated circuit, wherein the comparator sets the output of the differential amplifier being constant irrespective of the distance between the giant magnetic resistance element and the object to be observed by the giant magnetic resistance element, as the criterion for deciding the position of an object to be observed.

DETAILED DESCRIPTION OF THE PREFERRED EMBODIMENTS

Preferred embodiments of a magnetic field sensing element according to the present invention will now be described.

Embodiment 1

Figure 1:
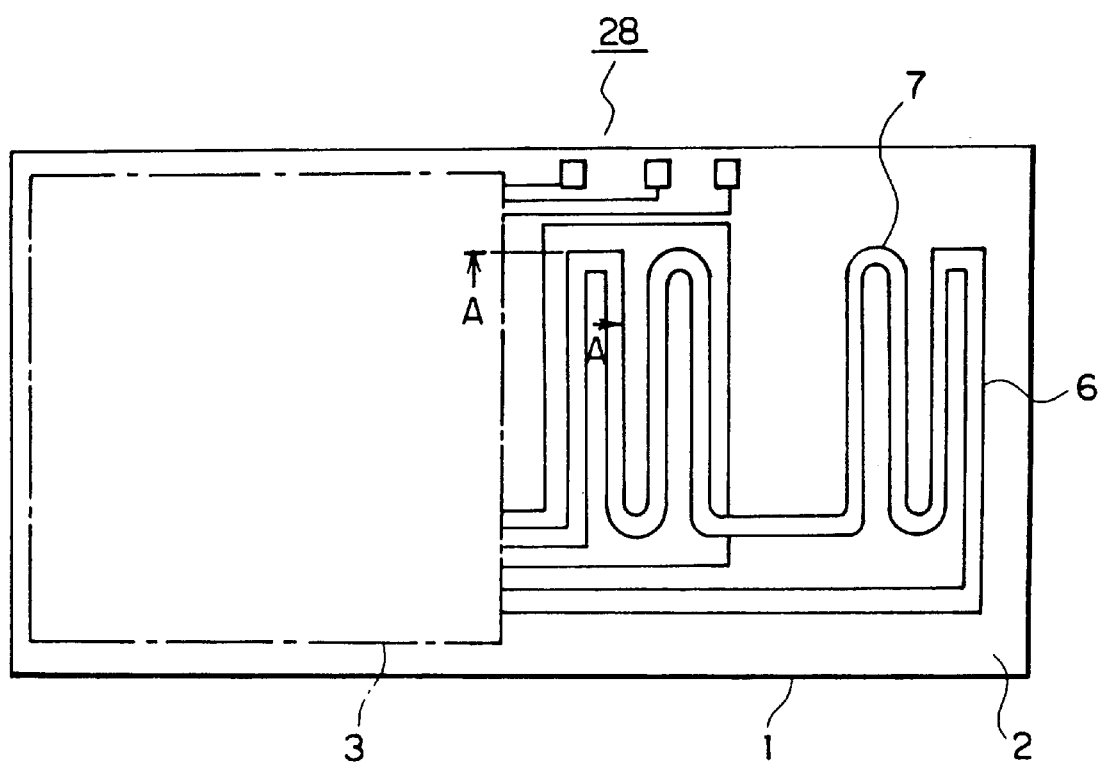
FIG. 1 is a plan view showing the structure of a magnetic field sensing element according to Embodiment 1 of the present invention.
Figure 2:
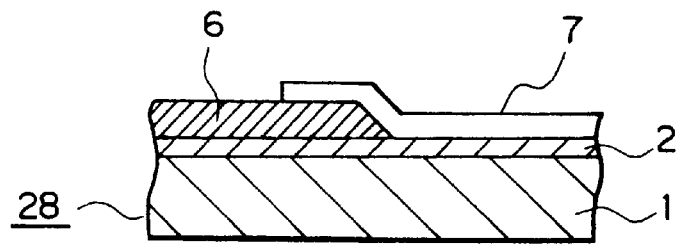
FIG. 2 is a sectional view showing the structure of the magnetic field sensing element according to Embodiment 1 of the present invention.
Figure 3:
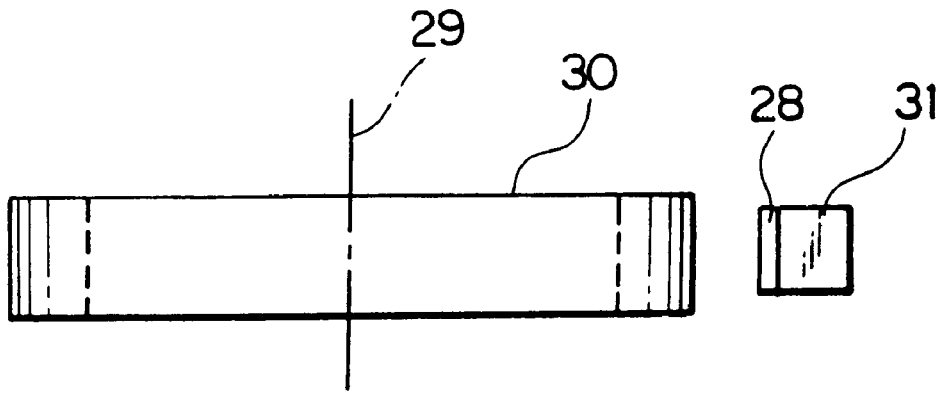
FIG. 3 is a side view showing the structure of a magnetic field sensing device according to Embodiment 1 of the present invention.
Figure 4:
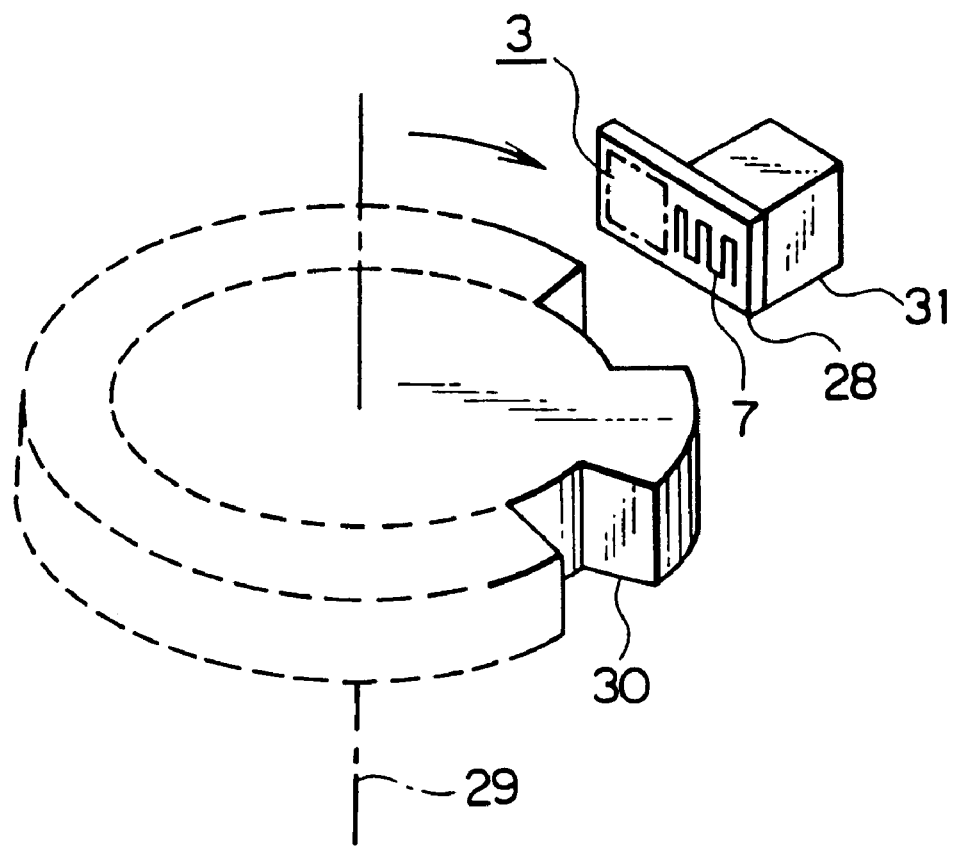
FIG. 4 is a perspective view showing the structure of the magnetic field sensing device according to Embodiment 1 of the present invention.
Figure 5:
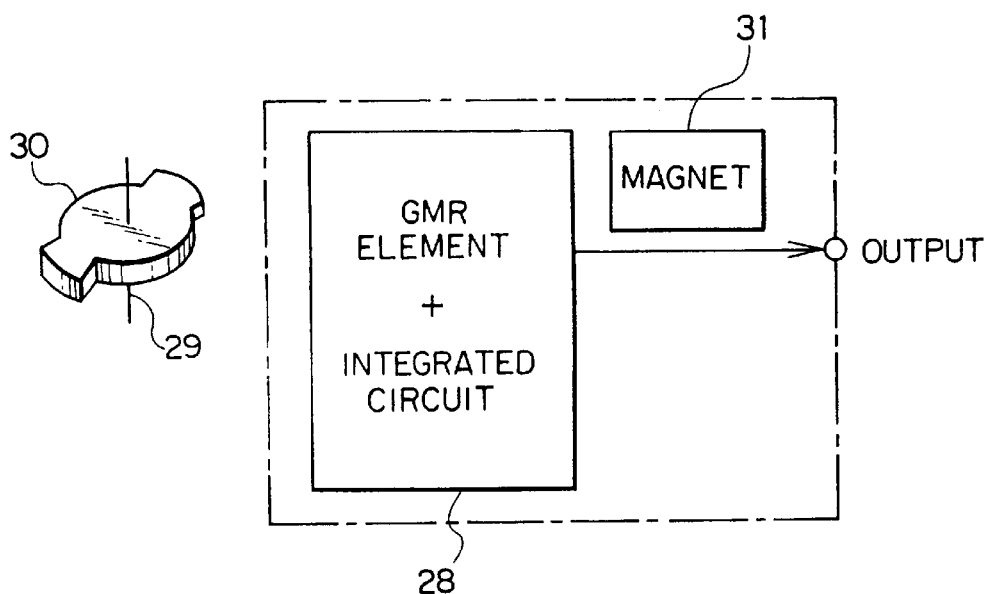
FIG. 5 is a block diagram schematically showing the internal structure of the magnetic field sensing device according to Embodiment 1 of the present invention.

FIG. 1 is a plan view showing the structure of a magnetic field sensing element according to Embodiment 1 of the present invention. FIG. 2 is a sectional view taken along the line A—A of FIG. 1. FIGS. 3 and 4 are a side view and a perspective view, respectively, showing the structure of a magnetic field sensing device according to Embodiment 1 of the present invention. FIG. 5 is a block diagram schematically showing the internal structure of the magnetic field sensing device according to Embodiment 1 of the present invention.

As shown in FIGS. 1 and 2, a magnetic field sensing element 28 according to Embodiment 1 of the present invention comprises wiring 6 and a GMR element 7 on an underlayer 2 formed on a substrate 1.

As shown in FIGS. 3 and 4, the magnetic field sensing device comprises a magnetic rotating body 30 which has at least one concavity and convexity along its outer periphery and which rotates synchronously with the rotation of a rotation axis 29, a magnetic field sensing element 28 arranged so as to face the outer periphery of the magnetic rotating body 30 with a predetermined gap therebetween, a magnet 31 for applying a magnetic field to a GMR element 7 of the magnetic field sensing element 28, and an integrated circuit 3 for processing output of the GMR element 7.

In Embodiment 1, the GMR element is formed on the same surface the integrated circuit is formed.

As described above, since the GMR element is formed of a super thin film layer with a thickness of several Å to several dozen Å, it is liable to be effected by subtle unevenness of the surface of the underlayer on which the GMR element is arranged.

When the unevenness of the surface of the underlayer is considerable, the GMR element does not show any change in resistance. As the surface of the underlayer becomes smoother, the rate of change in resistance of the GMR element becomes larger. However, the magnetic field for generating the change in resistance is required to be larger accordingly.

Figure 6:
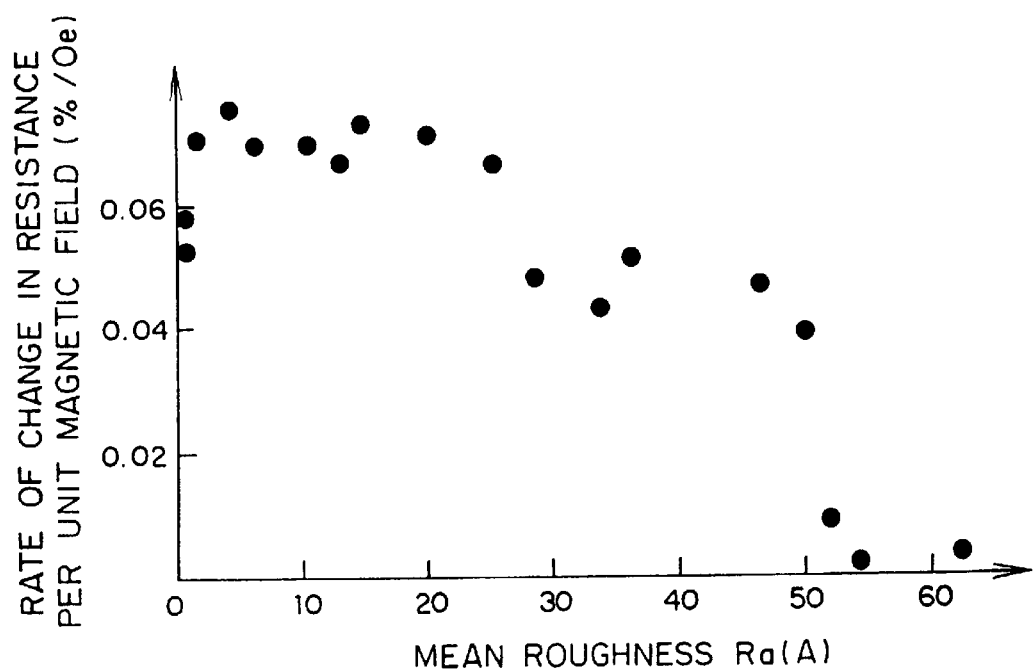
FIG. 6 is a graph showing the characteristics of the relationship between the rate of change in resistance per unit of magnetic field and the surface roughness of the underlayer of the magnetic field sensing element of the present invention.

FIG. 6 is a graph showing the characteristics of the relationship between the rate of change in resistance per unit magnetic field and the surface roughness of the underlayer of the magnetic field sensing element.

The rate of change in resistance per unit magnetic field (hereinafter referred to as the magnetic field sensitivity) shown in FIG. 6 shows characteristics in the case where, as a substrate on which a GMR element is arranged, a substrate on which an underlayer of Si, an Si thermal oxide film, silicon oxide, silicon nitride, tantalum oxide or the like is formed by sputtering, a soda glass substrate, and various kinds of ceramic substrates are used.

The smoothness of the surface of the underlayer can be measured by using AFM (Atomic Force Microscope) or the like. In FIG. 6, the smoothness is represented by the mean roughness (Ra).

As can be seen in FIG. 6, a large magnetic field sensitivity of the GMR element can be obtained when the average of surface roughness Ra is 50 Å or less, and in particular, the best magnetic field sensitivity can be obtained when the average of surface roughness Ra is 1 Å or more and 25 Å or less.

Further, the GMR element is electrically connected with the integrated circuit by a metal film formed in the process of forming the integrated circuit. In the integrated circuit, elements such as a transistor and a resistance are electrically connected by a metal film generally composed of an aluminum film. The GMR element is electrically connected with the integrated circuit by forming this aluminum film in a predetermined region necessary for connecting the GMR element with the integrated circuit.

The patterning process in which wiring is formed from this aluminum film is carried out by wet etching. The wiring can have a tapered shape in section by utilizing the characteristics of isotropic etching by wet etching, and thus, the connecting portion between the GMR element and the aluminum film can have a shape that is advantageous in terms of strength.

FIGS. 7 to 10 are conceptual views showing the manufacturing process of the magnetic field sensing element according to Embodiment 1 of the present invention.

Figure 7:
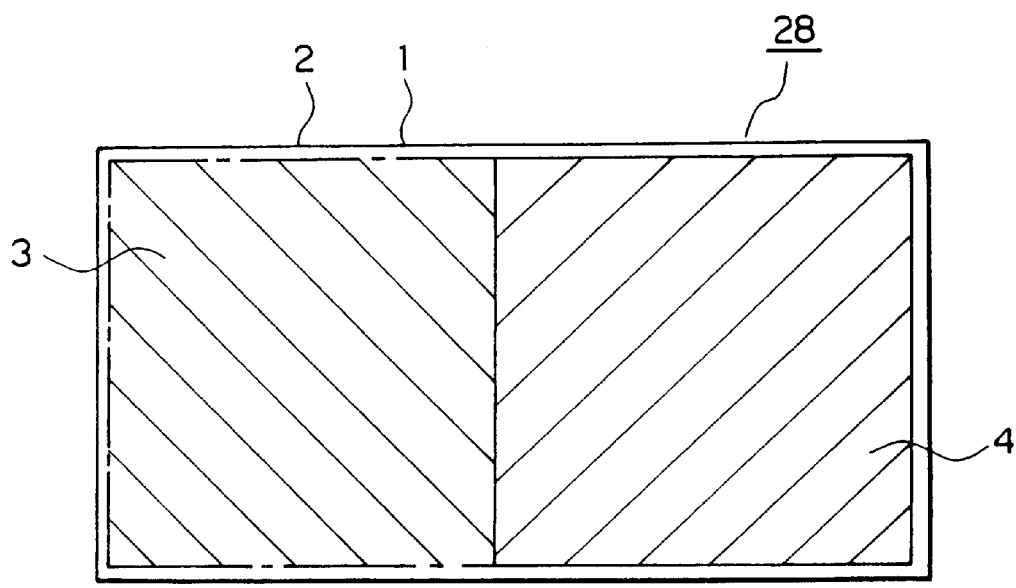
FIG. 7 is a conceptual view showing the manufacturing process of the magnetic field sensing element according to Embodiment 1 of the present invention.

First, as shown in FIG. 7, in the process of forming the integrated circuit of the magnetic field sensing element 28, a metal film 4, such as an aluminum film, is formed on the surface of the underlayer 2 of an Si thermal oxide film or the like formed on the substrate 1, for example, an Si substrate. Then, when the integrated circuit 3 is formed, a portion of the metal film 4 without the integrated circuit formed thereon (the right half on the substrate 1) remains unpatterned.

Figure 8:
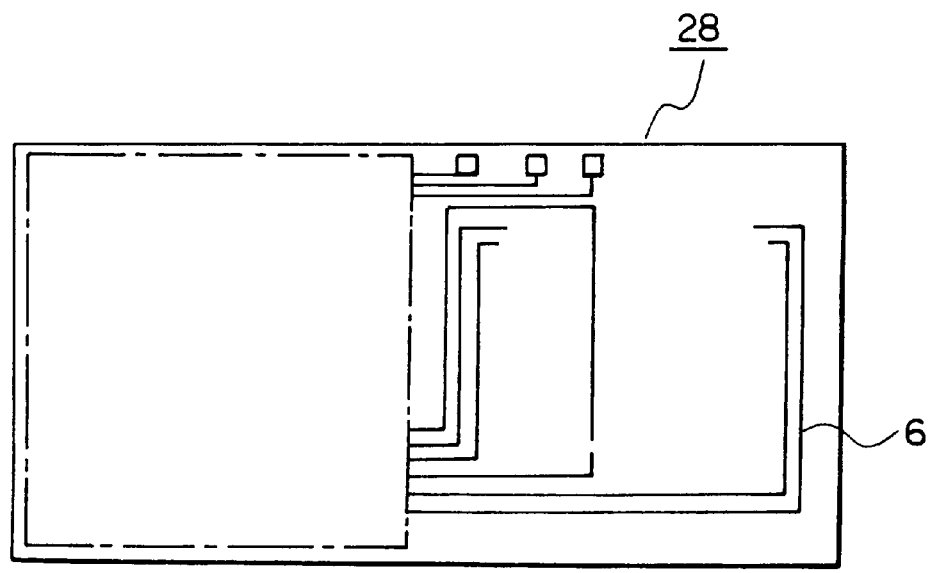
FIG. 8 is a conceptual view showing the manufacturing process of the magnetic field sensing element according to Embodiment 1 of the present invention.
Figure 9:
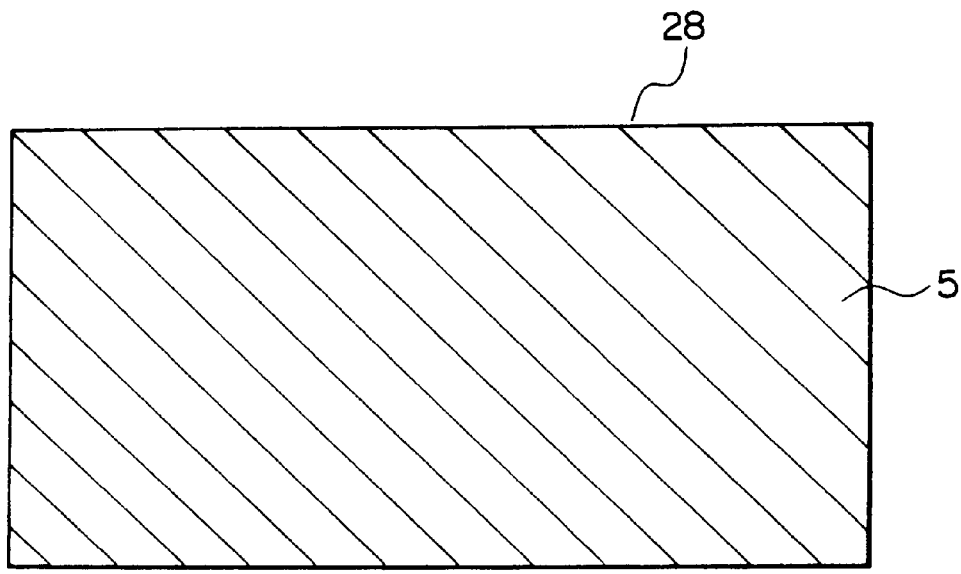
FIG. 9 is a conceptual view showing the manufacturing process of the magnetic field sensing element according to Embodiment 1 of the present invention.
Figure 10:
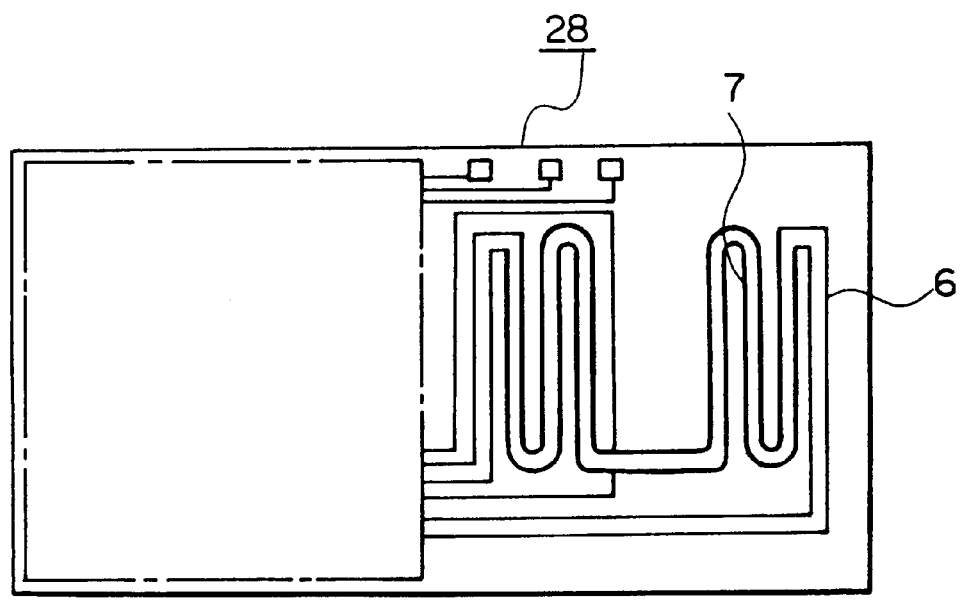
FIG. 10 is a conceptual view showing the manufacturing process of the magnetic field sensing element according to Embodiment 1 of the present invention.

Then, as shown in FIG. 8, the metal film 4 is patterned into predetermined wiring 6 utilizing photolithographic transfer. Thereafter, as shown in FIG. 9, a GMR element film 5 is formed on the entire surface, and, as shown in FIG. 10, the GMR element 7 is patterned utilizing the photolithographic transfer.

In this way, in Embodiment 1, the GMR element 7 is formed on the underlayer 2 formed on the substrate 1, and further, a portion of the metal film 4 for forming the integrated circuit 3 is used as the wiring 6 for electrically connecting the integrated circuit 3 with the GMR element 7. Therefore, unlike the conventional case, it is not necessary to electrically connect a GMR element formed on a film surface and an integrated circuit formed on another film surface, and it is not necessary to newly form a metal film for forming the wiring. Accordingly, higher productivity and lower cost of a magnetic field sensing element 28 and a magnetic field sensing device using the magnetic field sensing element can be attained.

Further, since mean surface roughness of the underlayer 2 on which the GMR element 7 is formed, is made to be 50 Å or less, and preferably, between 1 Å and 25 Å, the characteristics of the GMR element 7 can be improved, and a highly accurate magnetic field sensing element can be provided.

Further, since the metal film 4 at the connecting portion between the wiring 6 and the GMR element 7 can be made with a tapered shape in section by using wet etching to carry out the patterning process for forming the wiring 6 from the metal film 4, breakage at the connecting portion is considerably inhibited, and thus, the reliability of the magnetic field sensing element 28 and a magnetic field sensing device using the magnetic field sensing element 28 can be improved.

Embodiment 2

In Embodiment 1, the wiring 6 can be satisfactorily connected with the GMR element 7 by forming the GMR element film 5 as a giant magnetic resistance element on the patterned metal film (i.e., the wiring 6 shown in FIG. 10) and on the underlayer 2 (see FIGS. 8 and 9) and patterning the GMR element film 5.

However, the thickness of the GMR element 7 is about 500 Å–2000 Å, which is relatively thinner than the metal film 4 forming the wiring 6, and thus, if the metal film 4 is sufficiently thicker than the GMR element 7, the connecting state at the connecting portion between the wiring 6 and the GMR element 7 may become unstable. This is because the GMR element 7, which is thinner than the metal film 4 forming the wiring 6, may break due to a large difference in their levels at the connecting portion.

In this case, a sufficient connecting state can be obtained by making the respective surfaces on which the wiring 6 and the GMR element 7 are formed substantially the same height. A description of such method will be made below.

Figure 11:
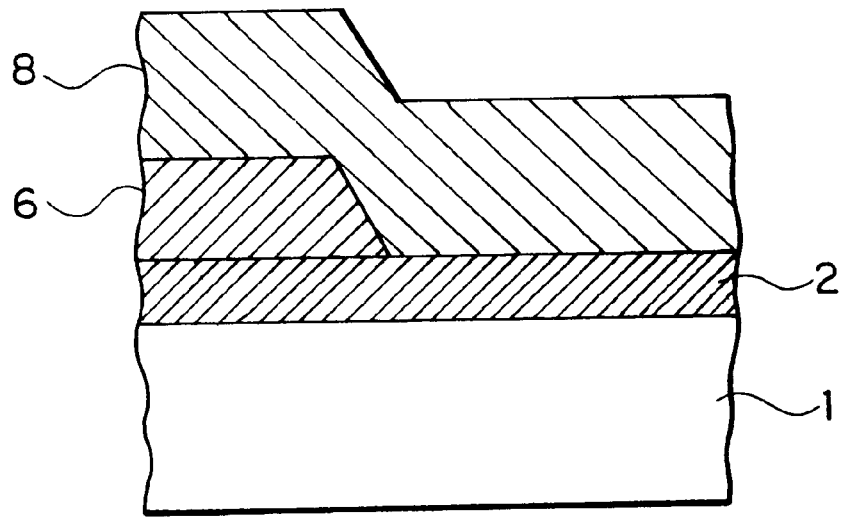
FIG. 11 is a partial sectional view of a magnetic field sensing element according to Embodiment 2 of the present invention.
Figure 12:
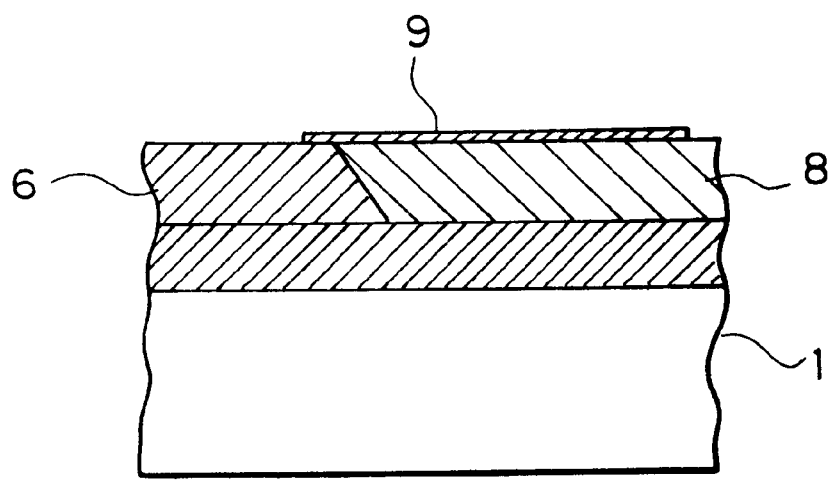
FIG. 12 is a partial sectional view of the magnetic field sensing element according to Embodiment 2 of the present invention.

FIGS. 11 and 12 are partially sectional views of a magnetic field sensing element according to Embodiment 2 of the present invention.

Suppose that, for instance, the thickness of the metal film 4 is 1 μm. As shown in FIG. 11, an Si oxide film 8 with a thickness of 1.5 μm is formed, as a first level difference buffer layer, on the wiring 6, formed by patterning the metal film 4, and on the underlayer 2.

Then, the surface of the Si oxide film 8 is polished with ultrafine particles, diamond particles and the like. When the thickness to be polished away is a little more than 1.5 μm, the difference in the levels between the surface of the Si oxide film 8 and the surface of the metal film 4 for forming the wiring 6 can be made sufficiently smaller than the film thickness of the GMR element 7, and thus, as can be seen from the sectional view after polishing in FIG. 12, the surfaces of the wiring 6 and the Si oxide film 8 can be made flush.

If the GMR element 9 is formed on the wiring 6 and the Si oxide film 8 after making their surfaces flush in the above way, there is no difference in the level between the wiring 6 and the GMR element 9 at the connecting portion, and thus, the connection state can be improved. It is to be noted that, since the abrasive grains used for polishing the Si oxide film 8 are sufficiently fine, the surface after polishing is sufficiently smooth and satisfactory GMR element characteristics can be obtained.

Above description, a case is described where the Si oxide film 8 is used. However, when an insulating layer of tantalum oxide, silicon nitride, or the like is used, the same effect as above description can be obtained.

Embodiment 3

Figure 13:
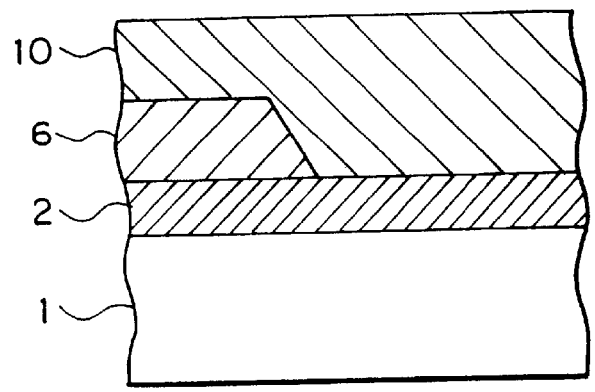
FIG. 13 is a sectional view conceptually showing the manufacturing process of a magnetic field sensing element according to Embodiment 3 of the present invention.
Figure 14:
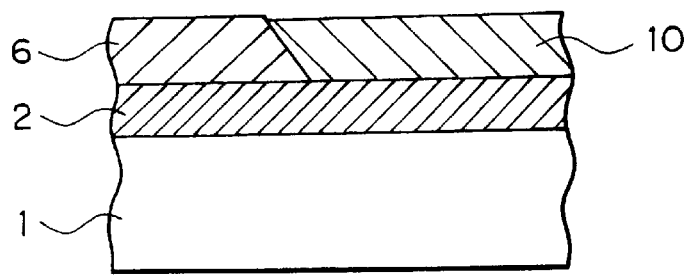
FIG. 14 is a sectional view conceptually showing the manufacturing process of the magnetic field sensing element according to Embodiment 3 of the present invention.

FIGS. 13 and 14 are sectional views conceptually showing the manufacturing process of a magnetic field sensing element according to Embodiment 3 of the present invention.

Figure 15:
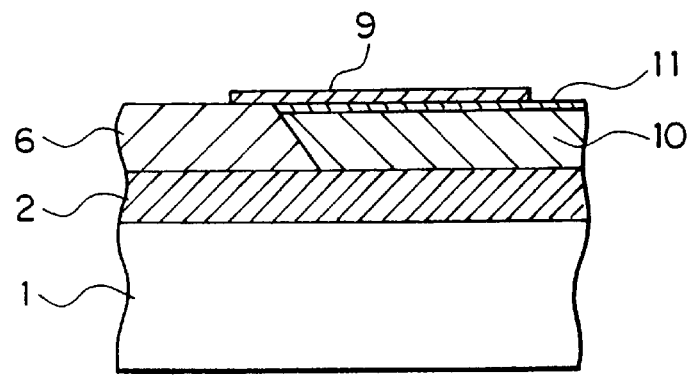
FIG. 15 is a sectional view conceptually showing the magnetic field sensing element according to Embodiment 3 of the present invention.

FIG. 15 is a sectional view conceptually showing the magnetic field sensing element according to Embodiment 3 of the present invention.

In Embodiment 3, by applying a resist or a resin layer of polyimide, PVSQ (silicon ladder polymer), or the like as a first level difference buffer layer by spin coating, the surface on which the surface on which the wiring is formed and the surface on which the GMR element is formed are made flush.

For example, similar to Embodiment 2, when, a resist 10 with a thickness of 2 μm is applied onto the entire surface by spin coating after the metal film with a thickness of 1 μm has been patterned to form the wiring 6, the surface of the resist 10 becomes flat without a level difference as shown in FIG. 13.

Then, the surface of the resist 10 is removed by resist ashing and the like to evenly thin the resist 10. By removing the resist 10 until the upper surface of the wiring 6 appears, the difference of the level between the surface of the resist 10 and the surface of the metal film 4 for forming the wiring 6 can be made sufficiently smaller than the film thickness of the GMR element 9 as shown in FIG. 14, and the upper surface of the wiring 6 with the surface on which the GMR element 9 is formed can thereby be made substantially flush in section after the resist ashing.

A thin film such as an Si oxide film with a thickness of 1,000 Å, for instance, is formed on the entire upper surface of the above formed wiring 6 and the resist 10, and the thin film formed on the wiring 6 is removed by photolithography and RIE (reactive ion etching) to leave only an Si oxide film 11 on the resist 10 and expose the wiring 6 (see FIG. 15).

The rest of the process forming the GMR element 9 comprises similar to Embodiment 2, as shown in FIG. 15.

In the above description, resist ashing is used as the method of thinning the resist 10. However, RIE (reactive ion etching), IBE (ion beam etching), wet etching using an etchant or the like can remove the resist in a way similar to above case.

Further, since the resist is easily effected by a solvent or the like, the Si oxide film 11 with a thickness of 1,000 Å is formed on the resist 10 before the GMR element 9 is formed, to prevent the resist 10 from being removed when the GMR element 9 is patterned.

It is to be noted that, if a solvent that is not capable of dissolving the resist layer is used in the process of patterning the GMR element 9, the above mentioned Si oxide film need not be formed.

Embodiment 4

Figure 16:
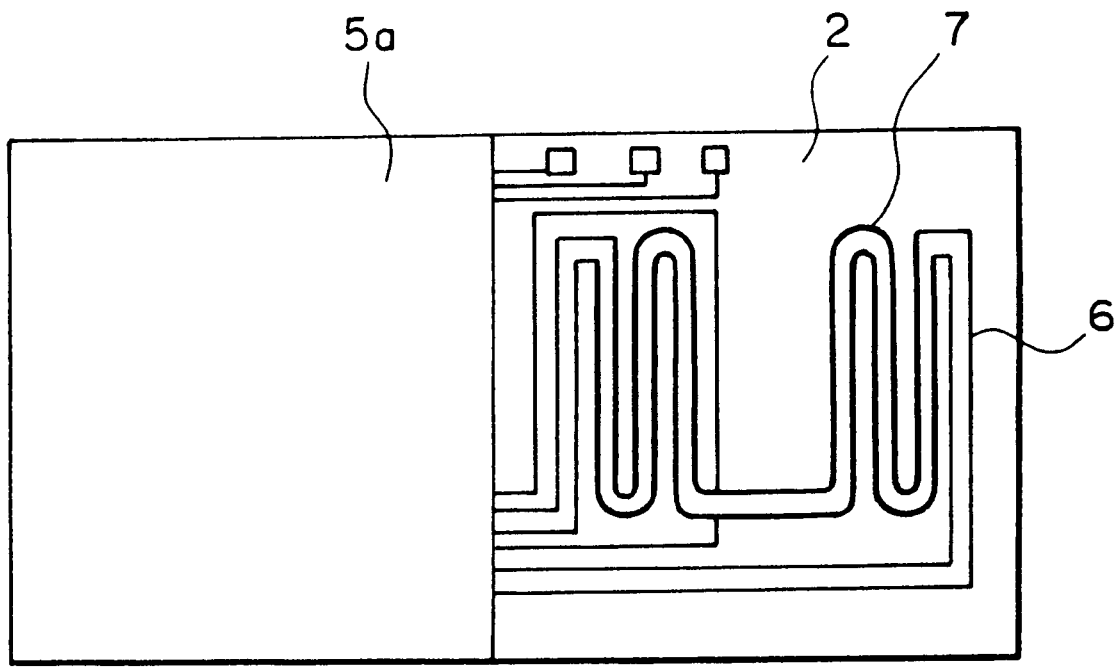
FIG. 16 shows an essential portion of a magnetic field sensing element according to Embodiment 4 of the present invention.

FIG. 16 shows an essential portion of a magnetic field sensing element according to Embodiment 4 of the present invention.

In Embodiment 4, after the GMR element film as a giant magnetic resistance element is formed on the entire upper surface of the underlayer 2 and the wiring 6, a GMR element film 5a formed on the integrated circuit is left unremoved and the GMR element 7 is patterned.

This type of patterning of the GMR element 7 is generally carried out by IBE. Accordingly, if, as in Embodiment 1, only the portion to be used as the GMR element 7 is left and the patterning is carried out, and the other portions are removed, ion collisions may damage the integrated circuit. However, in Embodiment 4, since the GMR element on the integrated circuit is not removed when the GMR element 7 is patterned, the integrated circuit can be protected from damage due to ion collisions. As a result, the reliability of the magnetic field sensing element can be improved.

Embodiment 5

Figure 17:
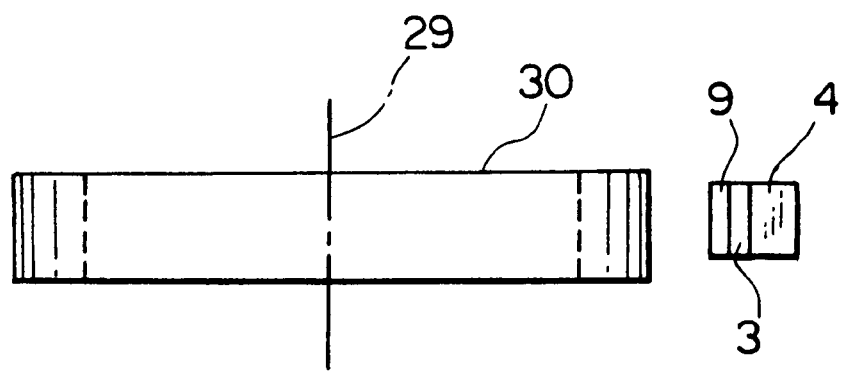
FIG. 17 is a side view showing the structure of a magnetic field sensing device according to Embodiment 5 of the present invention.
Figure 18:
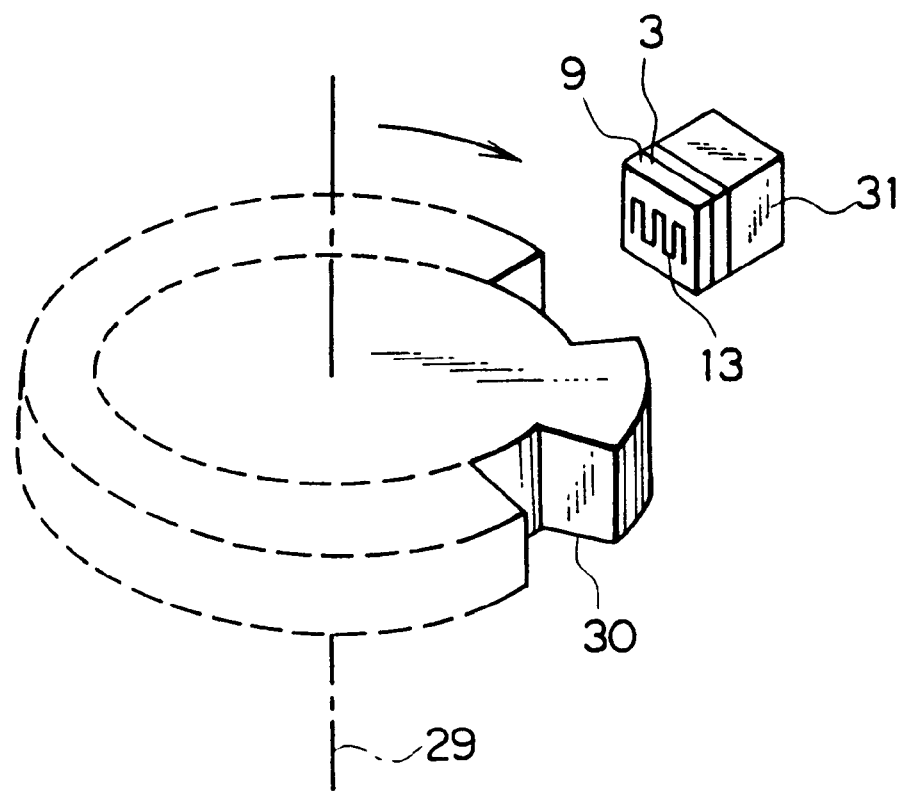
FIG. 18 is a perspective view showing the structure of the magnetic field sensing device according to Embodiment 5 of the present invention.

FIGS. 17 and 18 are a side view and a perspective view, respectively, showing the structure of a magnetic field sensing device according to Embodiment 5 of the present invention.

In Embodiment 5, as shown in FIGS. 17 and 18, the GMR element 9 as a giant magnetic resistance element is formed on the integrated circuit 3.

Figure 19:
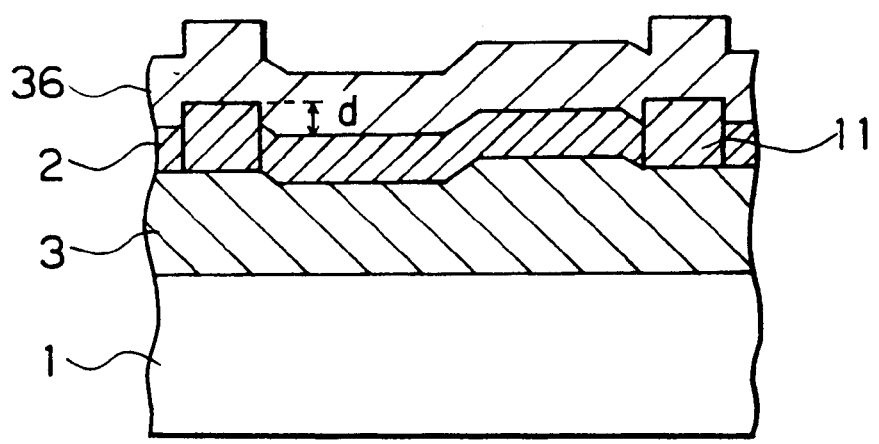
FIG. 19 is a conceptual view showing the structure in section during a manufacturing process of a magnetic field sensing element according to Embodiment 5 of the present invention.
Figure 20:
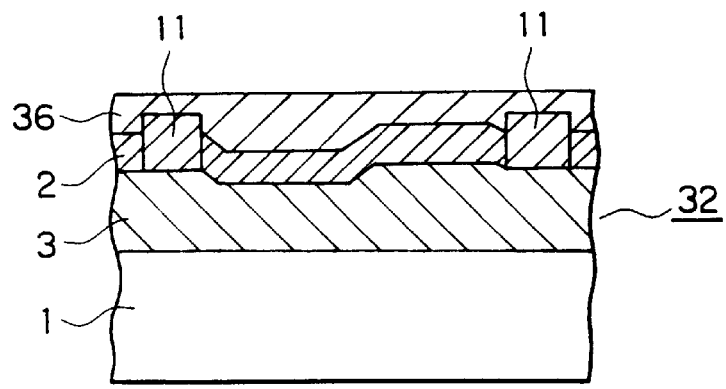
FIG. 20 is a conceptual view showing the structure in section during a manufacturing process of the magnetic field sensing element according to Embodiment 5 of the present invention.
Figure 21:
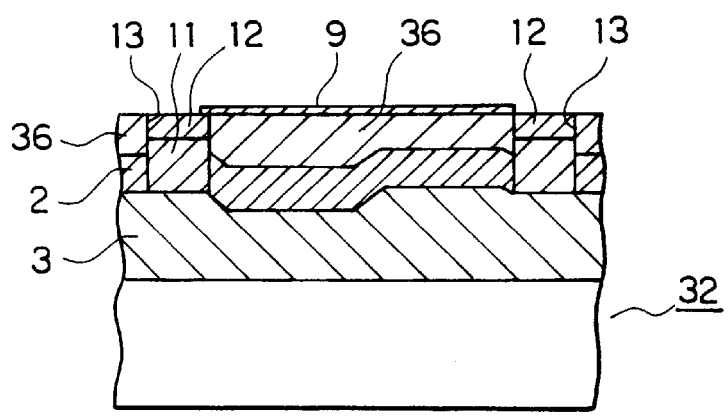
FIG. 21 is a conceptual view showing the structure in section during a manufacturing process of the magnetic field sensing element according to Embodiment 5 of the present invention.

FIGS. 19, 20, and 21 are conceptual views showing the structure in section during a manufacturing process of a magnetic field sensing element used in the magnetic field sensing device according to Embodiment 5 of the present invention.

As shown in FIG. 19, the integrated circuit 3, metal pads 11, and the underlayer 2 are formed on the substrate 1 by photolithographic transfer and RIE. Further, an Si oxide film 36 as a second level difference buffer layer is formed on the entire exposed upper surfaces of the metal pads 11 and the upper surface of the underlayer 2.

The Si oxide film 36 must be formed thicker than the maximum level difference d between the surfaces of the underlayer 2 and the surface of the metal pads 11 (see arrows in FIG. 19). For example, the Si oxide film 36 is about twice as thick as the maximum level difference d. The surface of the Si oxide film 36 is polished smooth in a way similar to Embodiment 2.

Here, the thickness of the Si oxide film 36 to be polished away is a little less than the maximum level difference d of the integrated circuit 3.

It is to be noted that, though FIGS. 19 to 21 show a portion where the metal pads 11 are formed directly on the integrated circuit 3, there is also a portion where the metal pads 11 are formed on the underlayer 2 which is an insulating layer, thus insulating the metal pads 11 and the integrated circuit 3.

After polishing is carried out as shown in FIG. 20, only the Si oxide film 36 on the metal pads 11 is removed by photolithographic transfer and RIE to form holes 13 above the metal pads 11 (FIG. 21 shows a state where the holes 13 are filled with a metal film 12). Then, the metal film 12 is formed in the holes 13 and on the entire upper surface of the Si oxide film 36. The thickness of the metal film 12 is a little more than the depth of the holes 13.

Further, after photolithographic transfer is conducted, by etching the metal film 12, only the metal film 12 formed on the Si oxide film 36 is removed to leave the metal film 12 only inside the holes 13, and the holes 13.

Here, the level difference which existed between the surface of the underlayer 2 and the surface of the metal pads 11 (see FIG. 19) does not exist on the Si oxide film 36, and thus, the Si oxide film 36 having a surface that is sufficiently smooth for forming the GMR element 9 thereon can be formed.

Then, as shown in FIG. 21, when the GMR element 9 is formed so as to be connected with the metal film 12 embedded in the holes 13, not only can the GMR element 9 be formed above the integrated circuit 3, but the integrated circuit 3 can also be electrically connected with the GMR element 9.

Since this makes it possible to reduce the area of the substrate 1, not only can the cost be lowered, but also a magnetic field sensing element 32 and a magnetic field sensing device using the magnetic field sensing element 32 can be miniaturized.

It is to be noted that since there is generally a level difference on the surface of the integrated circuit 3 and the GMR element 9 is strongly affected by even a subtle level difference on the surface of the underlayer 2, this level difference is eliminated before the GMR element 9 is formed.

Embodiment 6

Figure 22:
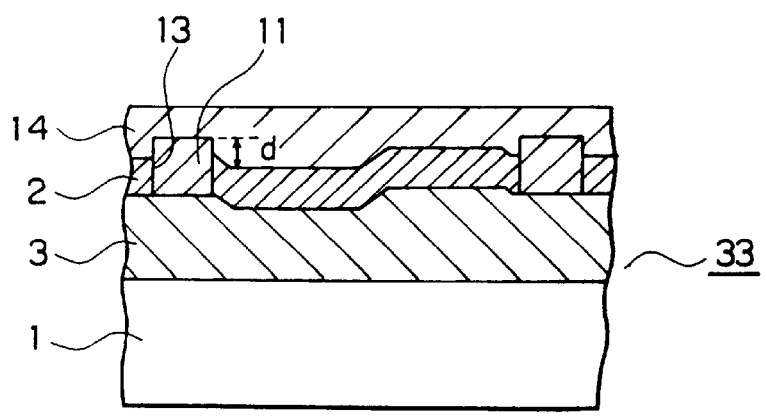
FIG. 22 is a conceptual view showing the structure in section of a magnetic field sensing element according to Embodiment 6 of the present invention.
Figure 23:
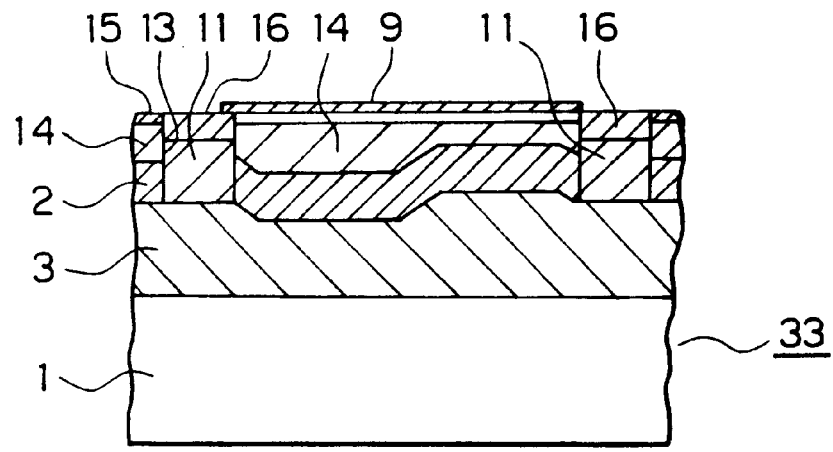
FIG. 23 is a conceptual view showing the structure in section of the magnetic field sensing element according to Embodiment 6 of the present invention.

FIGS. 22 and 23 conceptually show the structure in section of a magnetic field sensing element according to Embodiment 6 of the present invention.

In Embodiment 6, instead of the Si oxide film used in Embodiment 5, resist is used as a second level difference buffer layer to form a magnetic field sensing element.

As shown in FIG. 22, after the integrated circuit 3 is formed on the substrate 1, the metal pads 11 for electrically connecting with the integrated circuit 3 are formed, and resist 14 as the second level difference buffer layer is applied by spin coating to the exposed surfaces of the metal pads 11 and the entire surface of the underlayer 2. The thickness of the applied resist 14 is more than the maximum level difference d between the surface of the underlayer 2 and the surface of the metal pads 11. Here, for example, the resist 14 is formed so as to be about twice as thick as the maximum level difference d of the surface of the integrated circuit 3.

As shown in FIG. 22, the surface of the resist 14 as the second buffer layer is smooth. Further, an Si oxide film 15 with a thickness of, for example, 1,000 Å is formed on the resist 14.

It is to be noted that, although the Si oxide film 15 is used here, a film of some other appropriate material may be used.

Next, the Si oxide film 15 and the resist 14 on the metal pads 11 are removed to form the holes 13 above the metal pads 11 by photolithographic transfer, RIE, and resist ashing.

Since the resist 14 is easily dissolved in etchant used for forming the holes 13, the Si oxide film 15 is formed on the resist 14 to prevent the resist, except the portions for forming the holes 13 therein, from being dissolved in the etching process,. Therefore, if a solvent that does not dissolve the resist 14 is used in the etching process, the Si oxide film 8 need not be formed.

Then, a metal film 16 is formed in the holes 13 and on the entire surface of the Si oxide film 15. The thickness of the metal film 16 is a little more than the depth of the holes 13 (this state is not shown).

Further, the metal film 16 except the portions above the metal pads 11 is removed by photolithographic transfer and by etching.

As a result, as shown in FIG. 23, the holes 13 above the metal pads 11 can be filled with the metal film 16.

The level difference which existed on the surface of the integrated circuit 3 has been eliminated, and thus, a surface which is smooth enough for forming the GMR element 9 thereon can be obtained.

As shown in FIG. 23, the GMR element 9 can be formed over the integrated circuit 3 by forming the GMR element 9 on the Si oxide film 15 so as to be connected with the metal film 16 embedded in the resist 14 and the Si oxide film 15.

As a result, it possible to reduce the area of the substrate 1, and thus, not only can the cost be lowered, but a magnetic field sensing element 33 and a magnetic field sensing device using the magnetic field sensing element 33 can also be miniaturized.

Further, although a resist is used above description, a resin layer of polyimide, PVSQ, or the like may be applied by spin coating to obtain a similar effect.

Embodiment 7

Figure 24:
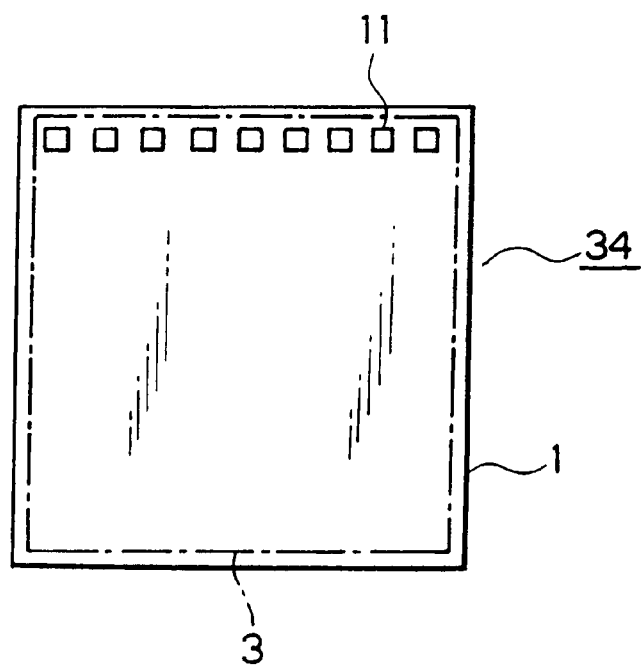
FIG. 24 shows the structure of the front surface of a magnetic field sensing element according to Embodiment 7 of the present invention.
Figure 25:
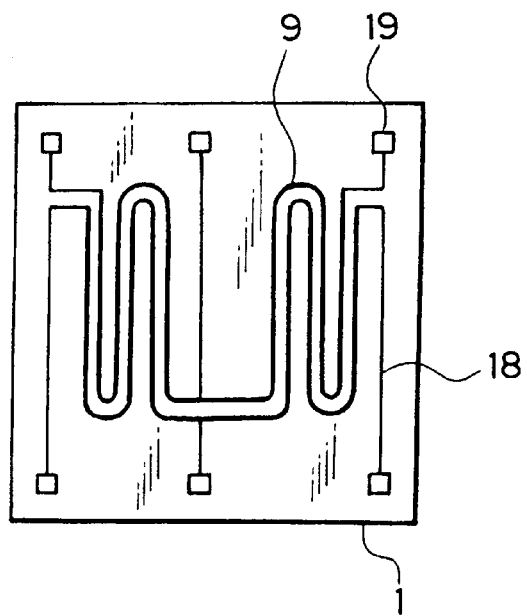
FIG. 25 shows the structure of the rear surface of the magnetic field sensing element according to Embodiment 7 of the present invention.

FIGS. 24 and 25 show the structure of the front surface and the back surface, respectively, of a magnetic field sensing element according to Embodiment 7 of the present invention.

Figure 26:
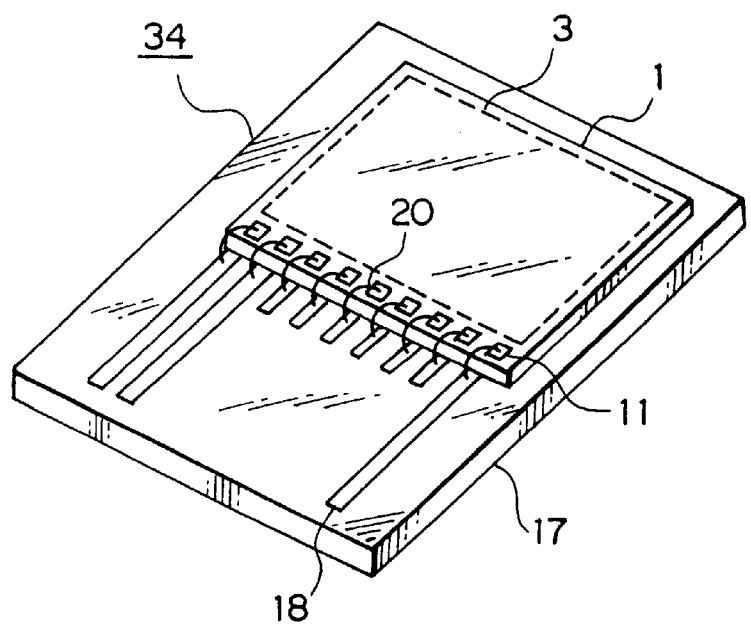
FIG. 26 is a perspective view of the magnetic field sensing element according to Embodiment 7 of the present invention.
Figure 27:
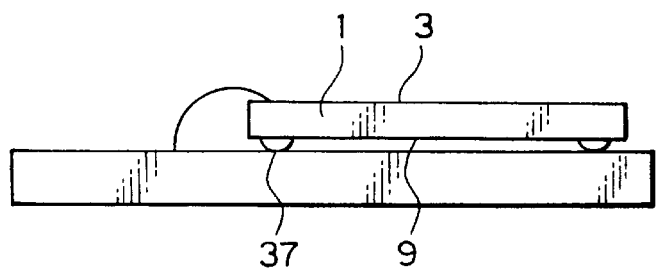
FIG. 27 is a side view of the magnetic field sensing element according to Embodiment 7 of the present invention.

FIGS. 26 and 27 are a perspective view and a side view, respectively, of the magnetic field sensing element according to Embodiment 7 of the present invention.

In Embodiment 7, the GMR element 9 is formed on a different plane than the plane of the substrate where the integrated circuit is formed.

As shown in FIGS. 26 and 27, the substrate 1 on which the GMR element 9 is formed is arranged on a substrate 17 as a second substrate such that the surface where the GMR element 9 is formed is covered by the substrate 17.

In this case, wiring 18 arranged on the substrate 17 is electrically connected via solder 37 with metal pads 19 on the surface where the GMR element 9 of the substrate 1 is formed. Further, the metal pads 11 on the surface where the integrated circuit 3 of the substrate 1 are formed is electrically connected via wires 20 with the wiring 18 on the substrate 17.

In this way, in Embodiment 7, since the GMR element 9 is formed on a different surface than the surface of the substrate 1 on which the integrated circuit 3 is formed, and metal pads 19 for connection are further provided, the area of the substrate 1 can be reduced. Therefore, not only can a magnetic field sensing element 34 and a magnetic field sensing device using the magnetic field sensing element 34 be miniaturized, but the cost can also be lowered.

It is to be noted that, the substrate 1 is arranged so that the surface on which the GMR element 9 is formed is covered by the substrate 17. However, a similar effect can be obtained by arranging the substrate 1 so that the surface on which the integrated circuit 3 is formed is covered by the substrate 17.

Embodiment 8

Figure 28:
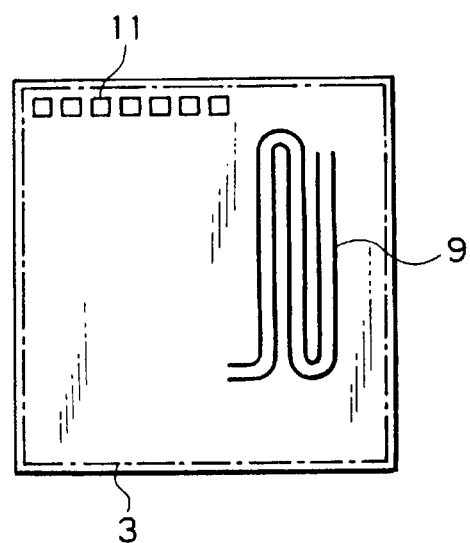
FIG. 28 shows the structure of the front surface of a magnetic field sensing element according to Embodiment 8 of the present invention.
Figure 29:
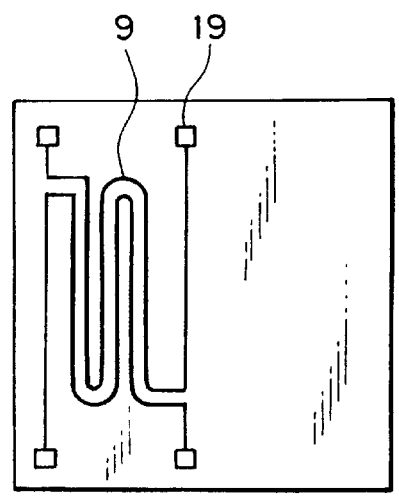
FIG. 29 shows the structure of the rear surface of the magnetic field sensing element according to Embodiment 8 of the present invention.

FIGS. 28 and 29 are a front view and a rear view, respectively, which show a magnetic field sensing element according to Embodiment 8 of the present invention.

Figure 30:
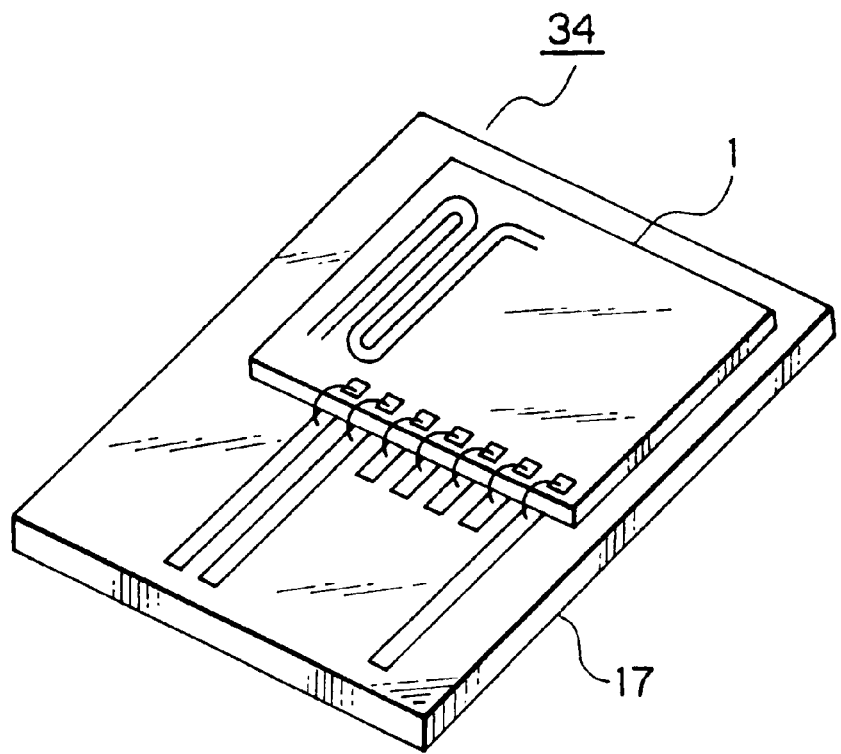
FIG. 30 is a perspective view of the magnetic field sensing element according to Embodiment 8 of the present invention.
Figure 31:
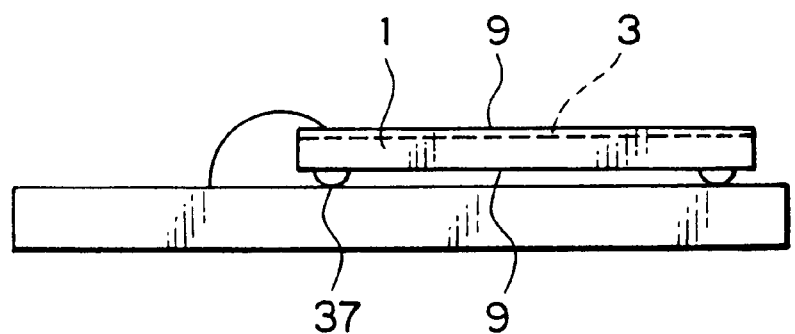
FIG. 31 is a side view of the magnetic field sensing element according to Embodiment 8 of the present invention.

FIGS. 30 and 31 are a perspective view and a side view of the magnetic field sensing element according to Embodiment 8 of the present invention.

In Embodiment 8, a GMR element 9 is formed on both surfaces of the substrate 1. More specifically, a GMR element 9 is formed on the integrated circuit 3 on the surface where the integrated circuit 3 is formed, similar to the case of Embodiment 5, and a GMR element 9 is also formed on the opposite surface. It is to be noted that the method of forming the GMR elements 9 and the like is similar to that in other embodiments.

In this way, if a GMR element 9 is formed on both surfaces of the substrate 1, a highly accurate magnetic field sensing element can be obtained. Further, there are also advantages in the area of the substrate can be reduced, a low-cost magnetic field sensing element can be obtained, and the magnetic field sensing element can be miniaturized.

Figure 32:
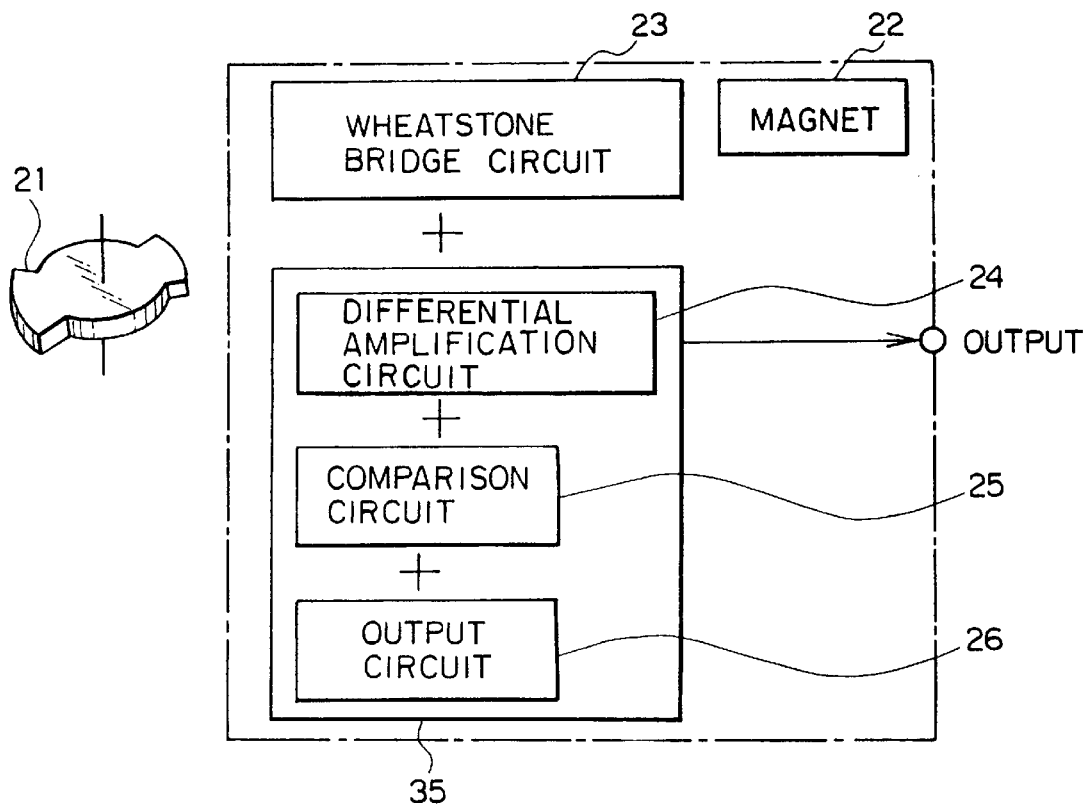
FIG. 32 is a block diagram conceptually showing the structure of a magnetic field sensing device according to Embodiment 8 of the present invention.

FIG. 32 is a block diagram conceptually showing the structure of a magnetic field sensing device according to Embodiment 8 of the present invention.

Figure 33:
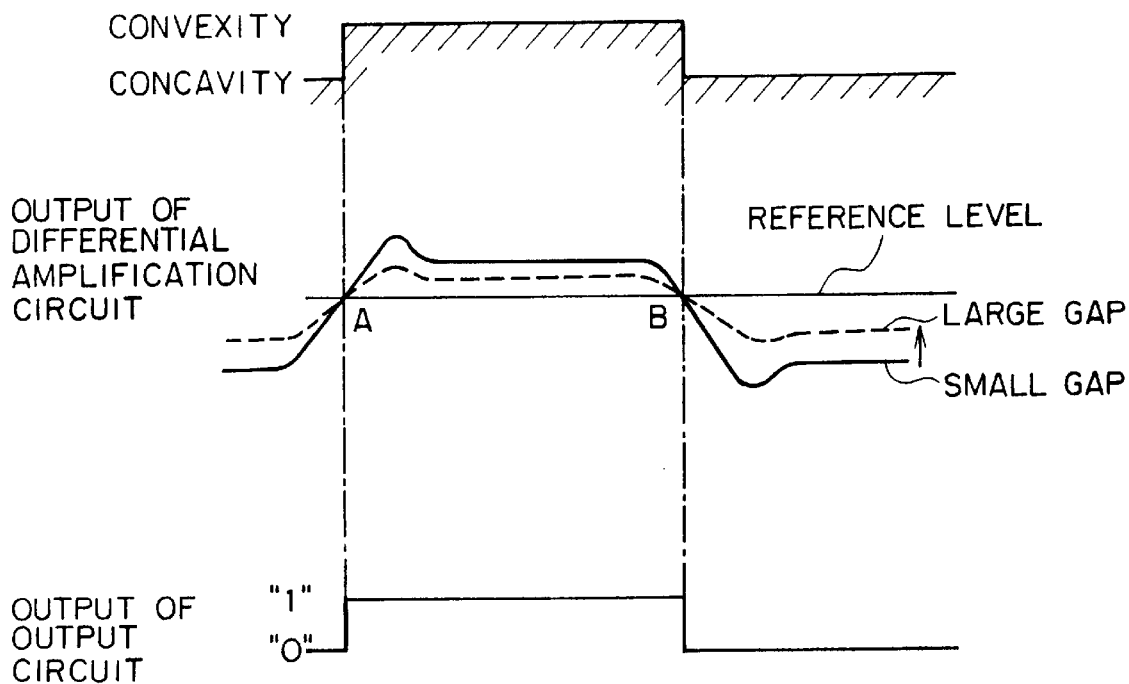
FIG. 33 is a graph showing operating characteristics of the magnetic field sensing element according to Embodiment 8 of the present invention.
Figure 34:
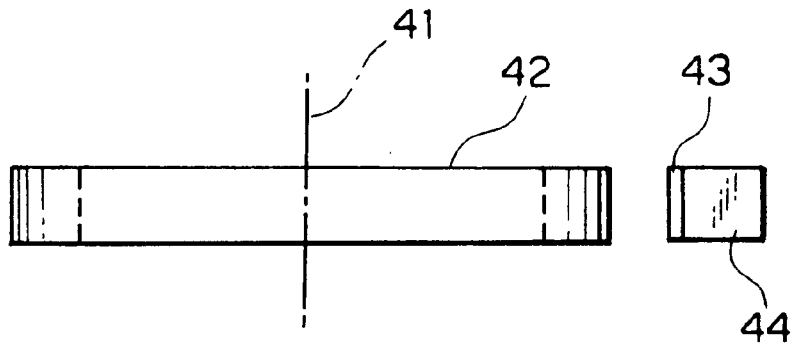
FIG. 34 is a side view showing the structure of a conventional magnetic field sensing device.
Figure 35:
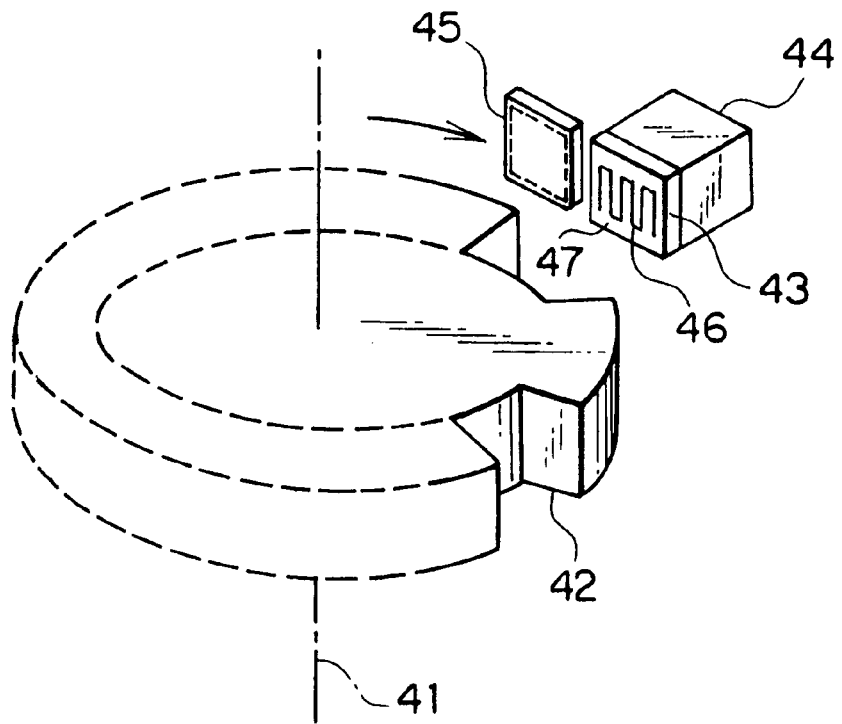
FIG. 35 is a perspective view showing the structure of the conventional magnetic field sensing device.
Figure 36:
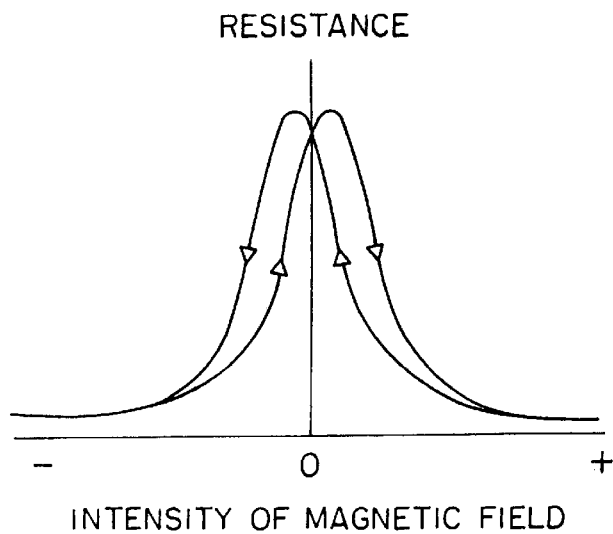
FIG. 36 is a graph showing the characteristics of a conventional GMR element.
Figure 37:
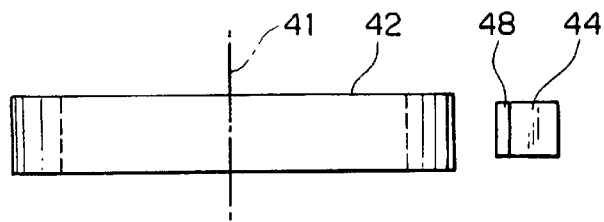
FIG. 37 is a side view showing the structure of a magnetic field sensing device using a conventional GMR element.
Figure 38:
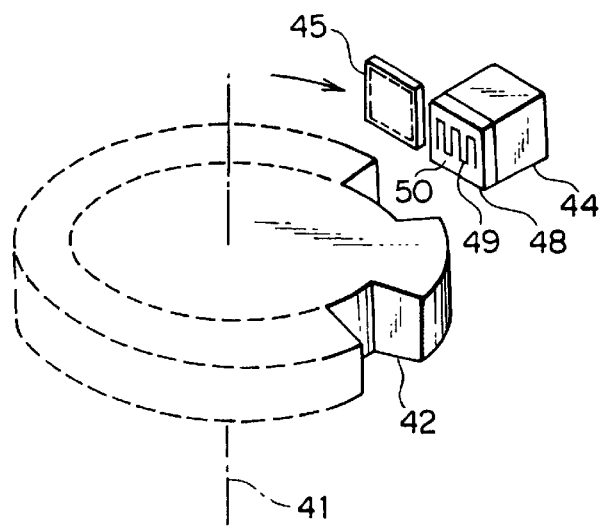
FIG. 38 is a perspective view showing the structure of the magnetic field sensing device using the conventional GMR element.
Figure 39:
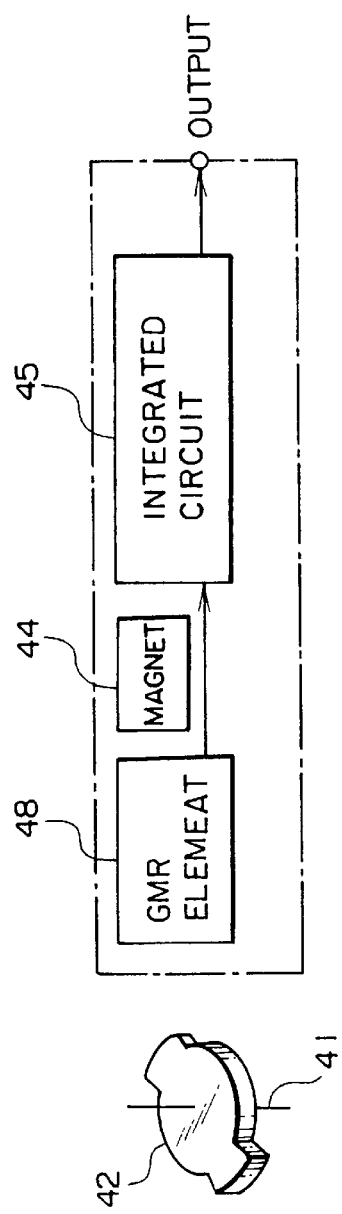
FIG. 39 is a block diagram showing the magnetic field sensing device using the conventional GMR element.
Figure 40:
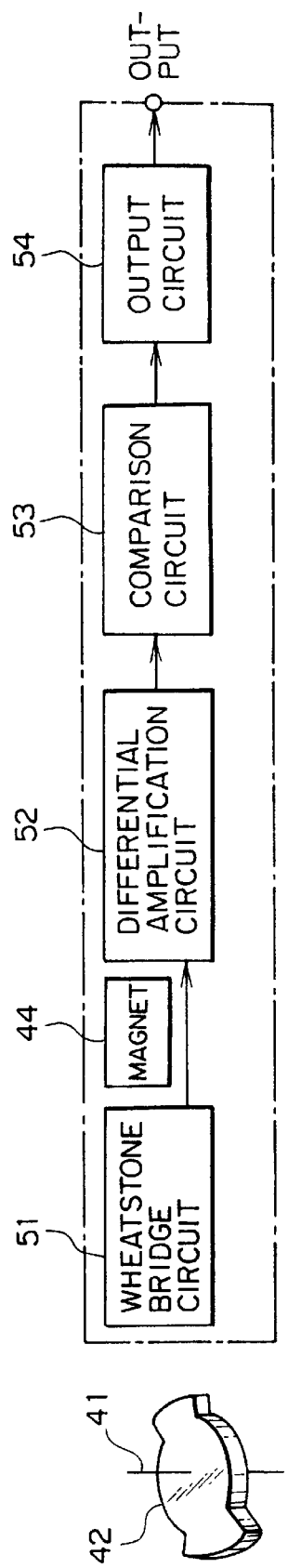
FIG. 40 is a block diagram showing the detail of the magnetic field sensing device using the conventional GMR element.

FIG. 33 is a graph showing operating characteristics of the magnetic field sensing element according to Embodiment 8 of the present invention.

As shown in FIG. 32, the magnetic field sensing device according to Embodiment 8 of the present invention is arranged with a predetermined gap between a magnetic rotating body 21, and comprises a Wheatstone bridge circuit 23 using the GMR element 9 to which a magnetic field is applied by a magnet 22, a differential amplification circuit 24 for amplifying the output of the Wheatstone bridge circuit 23, a comparison circuit 25 for comparing the output of the differential amplification circuit 24 with a reference value to output a signal of either "0" or "1," and an output circuit 26 for switching in response to the output of the comparison circuit 25.

Figure 41:
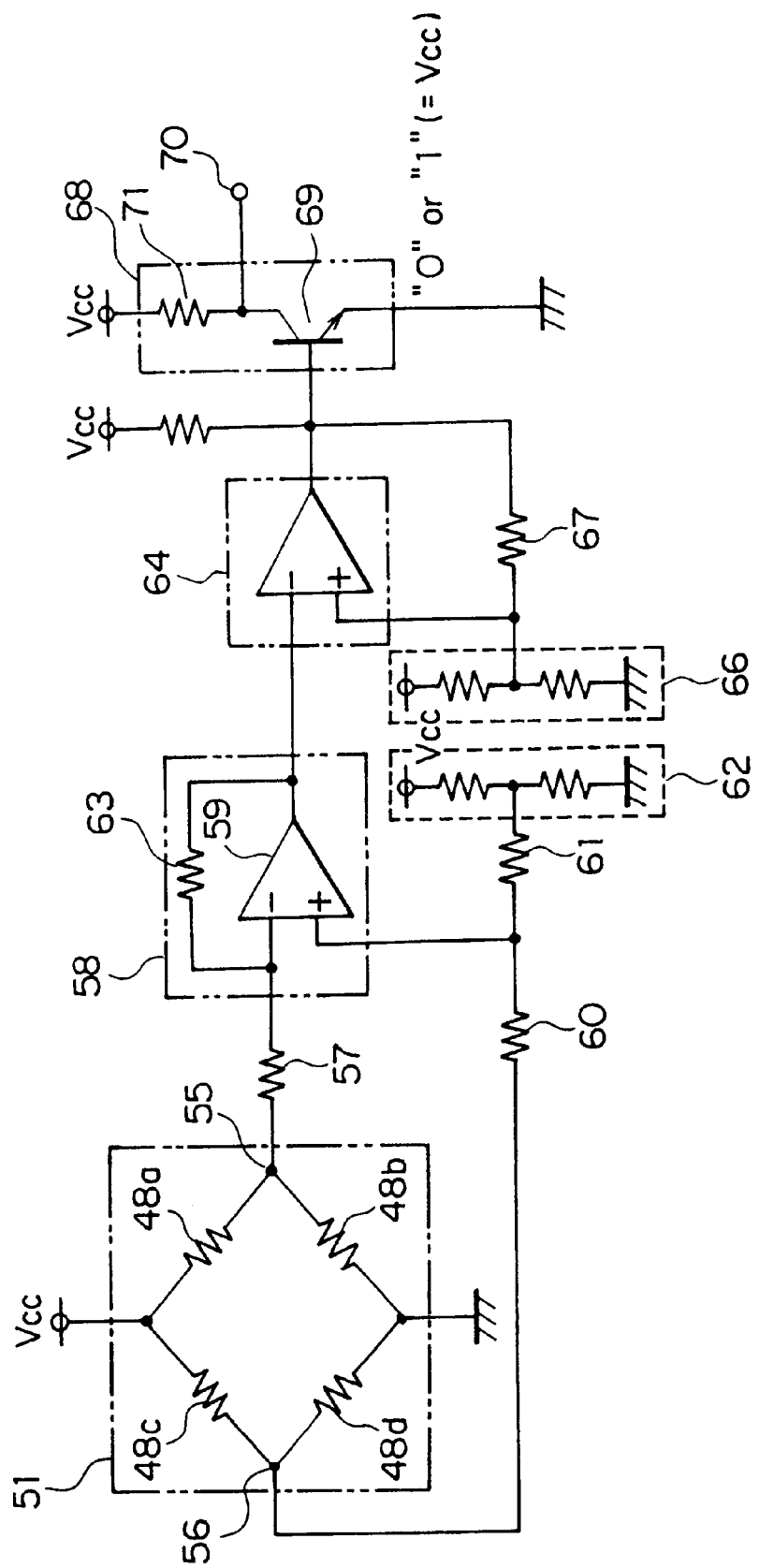
FIG. 41 shows an example of the structure of a circuit of the magnetic field sensing device using the conventional GMR element.
Figure 42:
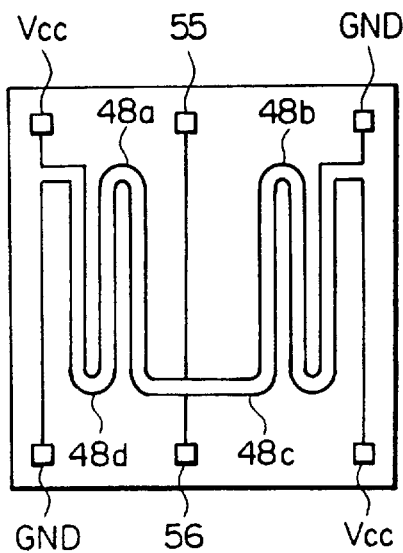
FIG. 42 shows the structure of the conventional magnetic field sensing element.
Figure 43:
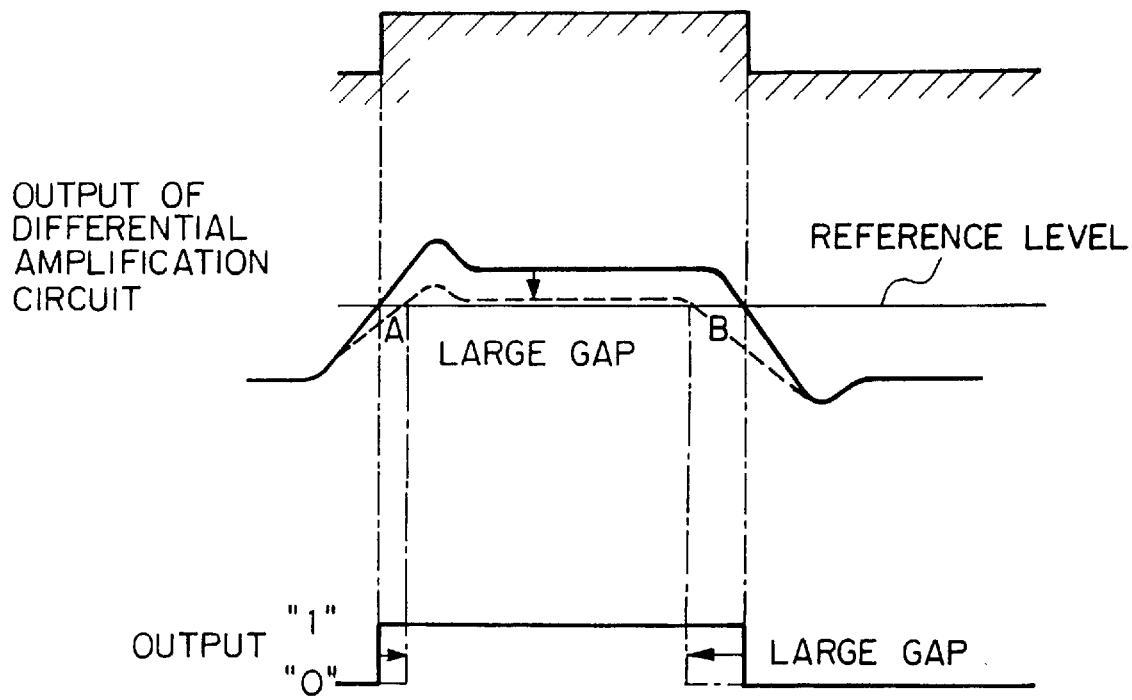
FIG. 43 is a graph showing operating characteristics of the conventional magnetic field sensing element.

Since the structure of the circuit of the Wheatstone bridge circuit 23 shown in FIG. 32 is similar to a conventional one (see FIG. 41), the description thereof is omitted.

In FIG. 32, rotation of the magnetic rotating body 21 causes a change in the magnetic field supplied to the GMR element 9 forming the Wheatstone bridge circuit 23. Then, as shown in FIG. 33, output corresponding to the concavities and the convexities of the magnetic rotating body 21 can be obtained at an output end of the differential amplification circuit 24.

Points A and B are output characteristics of the differential amplification circuit with respect to the change in the gap between the GMR element 9 and the magnetic rotating body 21, where the output of the differential amplifier is constant irrespective of the gap.

Therefore, by setting the reference value of the comparison circuit so as to pass the points A and B, the output of the comparison circuit can be changed at a predetermined position, irrespective of the gap amount, and thus, it is possible to make the gap characteristics satisfactory. Consequently, the amount of rotation of the magnetic rotating body 21 can be accurately ascertained.

As described above, in Embodiment 8, since the GMR element 9 is formed on a surface which is not the surface on which the integrated circuit 3 is formed, a highly accurate magnetic field sensing element 35 and a magnetic field sensing device using the magnetic field sensing element 35 can be obtained. Further, since the area of the substrate can be reduced, the cost of the magnetic field sensing element can be lowered. Further, by reducing the area of the substrate, the magnetic field sensing element can be miniaturized.

It is to be noted that, although the structure where the GMR element 9 is formed on the lower surface has been described, a similar effect can be obtained by forming the integrated circuit on the lower surface.

According to the present invention, the following advantages can be obtained. Since a magnetic field sensing element comprises an underlayer formed on a substrate, a giant magnetic resistance element formed on the underlayer for detecting a change in a magnetic field, and an integrated circuit formed on the substrate for carrying out predetermined arithmetic processing based on a change in a magnetic field detected by the giant magnetic resistance element, and the giant magnetic resistance element and the integrated circuit are formed on the same surface, the producability of the magnetic field sensing element can be improved and the cost can be lowered.

Further, since a metal film formed on the underlayer for forming the integrated circuit, not in a region for forming the integrated circuit, is patterned to form wiring for connecting the giant magnetic resistance element and the integrated circuit, it is not necessary to form new wiring for connection. Accordingly, a magnetic field sensing element with low cost and good producability can be formed.

Still further, since the wiring is formed by wet etching the metal film and has a tapered shape in section, the metal film at the connecting portion of the GMR element has a tapered shape in section, and thus, the reliability of the connecting portion can be improved.

Still further, the reliability of the connecting portion can be improved because a first level difference buffer layer is formed on the underlayer in a region for forming the giant magnetic resistance element to decrease a difference in the levels between the surface of the metal film for forming the wiring and a surface for forming the giant magnetic resistance element, and the giant magnetic resistance element is formed on the first level difference buffer layer.

Still further, since the first level difference buffer layer is formed of an insulating layer, and the difference in the levels between the first level difference buffer layer and the surface of the metal film for forming the wiring is sufficiently smaller than the film thickness of the giant magnetic resistance element, there is no level difference at the connecting portion between the GMR element and the metal film, and thus, the reliability of the connecting portion can be improved.

Still further, since the first level difference buffer layer is a resist layer or resin layer having fluid properties formed by spin coating, and the difference in the levels between the first level difference buffer layer and the surface of the metal film for forming the wiring is sufficiently smaller than the film thickness of the giant magnetic resistance element, there is no level difference at the connecting portion between the GMR element and the metal film, and thus, the reliability of the connecting portion can be improved.

Still further, since, in order to form the giant magnetic resistance element, the portion of the giant magnetic resistance element film formed on the integrated circuit is left unremoved and a protective film is formed on the unremoved giant magnetic resistance element film after a giant magnetic resistance element film is formed on the entire surface of the integrated circuit and the wiring, the integrated circuit is kept from being damaged by the patterning of the GMR element, and thus, the reliability of the magnetic field sensing element can be improved.

Still further, since a magnetic field sensing element in another embodiment of the present invention comprises an integrated circuit, an underlayer, and a metal pad formed on the substrate in the order stated, provided with a second level difference buffer layer formed on the underlayer and the metal pads to absorb the difference of the levels between the surface of the underlayer and the surface of the metal pads, and a giant magnetic resistance element formed on the second level difference buffer layer, the area of the substrate can be reduced, and thus, a low-cost magnetic field sensing element can be obtained. Further, there is an advantage in that the magnetic field sensing element can be miniaturized.

Still further, since the second level difference buffer layer has a surface smoothed by polishing, and the giant magnetic resistance element is formed on the smoothed surface of the second level difference buffer layer, the GMR element is formed on the integrated circuit the unevenness of which is smoothed by the polishing process, and thus, there is an advantage in that a highly accurate magnetic field sensing element can be obtained.

Still further, since the second level difference buffer layer is formed from a resist layer or resin layer having a smoothed surface formed by spin coating, and the giant magnetic resistance element is formed on the smoothed resist layer or resin layer, there is an advantage in that a highly accurate magnetic field sensing element can be obtained.

Still further, since a magnetic field sensing element in still another embodiment of the present invention comprises an underlayer formed on one surface of a substrate, a giant magnetic resistance element formed on the underlayer for detecting a change in a magnetic field, and an integrated circuit formed on the surface opposite to the surface where the giant magnetic resistance element of the substrate is formed for carrying out predetermined arithmetic processing based on a change in a magnetic field detected by the giant magnetic resistance element, the area of the substrate can be reduced, and thus, there is an advantage in that a low-cost magnetic field sensing element can be obtained. Further, there is an advantage in that the magnetic field sensing element can be miniaturized.

Still further, since an underlayer and a giant magnetic resistance element are further formed on the integrated circuit formed on the opposite surface of the substrate, there is an advantage in that a highly accurate magnetic field sensing element can be obtained. Further, there are advantages in that the area of the substrate can be reduced, a low-cost magnetic field sensing element can be obtained, and the magnetic field sensing element can be miniaturized.

Still further, since the average surface roughness of the underlayer is 50 Å or less, there is an advantage in that a highly accurate magnetic field sensing element can be obtained.

Still further, since the average of the surface roughness of the underlayer is between 1 Å and 25 Å, there is an advantage in that a highly accurate magnetic field sensing element can be obtained.

Further, since the magnetic field sensing element comprises a differential amplifier and a comparator on a line for transmitting output of the giant magnetic resistance element to the integrated circuit, and since the comparator sets the output of the differential amplifier which is constant irrespective of the distance between the giant magnetic resistance element and the object to be observed by the giant magnetic resistance element, as the criterion for determining the position of the object to be observed, there is an advantage in that a magnetic field sensing element with high accuracy can be obtained.

What is claimed is:

1. A magnetic field sensing element comprising:
   an underlayer formed on a substrate with mean surface roughness between 1 Å and 25 Å;
   a giant magnetic resistance element formed on said underlayer, for detecting a change in a magnetic field; and
   an integrated circuit formed on said underlayer for carrying out predetermined arithmetic processing based on a change in a magnetic field detected by said giant magnetic resistance element, wherein said giant magnetic resistance element and said integrated circuit are formed on the same surface.

* * * * *